(12) United States Patent
Lee et al.

(10) Patent No.: US 12,745,515 B2
(45) Date of Patent: Sep. 22, 2026

(54) DISPLAY APPARATUS

(71) Applicant: Samsung Display Co., Ltd., Yongin-si (KR)

(72) Inventors: Seunghyun Lee, Yongin-si (KR); Sewan Son, Yongin-si (KR); Sungho Kim, Yongin-si (KR); Minwoo Woo, Yongin-si (KR); Kwanhee Lee, Yongin-si (KR); Jiseon Lee, Yongin-si (KR); Kyeongwoo Jang, Yongin-si (KR); Sugwoo Jung, Yongin-si (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 378 days.

(21) Appl. No.: 18/507,194

(22) Filed: Nov. 13, 2023

(65) Prior Publication Data

US 2024/0324305 A1 Sep. 26, 2024

(30) Foreign Application Priority Data

Mar. 24, 2023 (KR) ........................ 10-2023-0039295

(51) Int. Cl.
*H10K 59/122* (2023.01)
*H10K 59/131* (2023.01)

(52) U.S. Cl.
CPC ......... *H10K 59/122* (2023.02); *H10K 59/131* (2023.02)

(58) Field of Classification Search
CPC .. H10K 59/122; H10K 59/353; H10K 50/814; H10K 59/131
See application file for complete search history.

(56) References Cited

U.S. PATENT DOCUMENTS

| | | | | |
|---|---|---|---|---|
| 11,348,983 | B1 | 5/2022 | Choung et al. | |
| 2007/0263164 | A1* | 11/2007 | Kumagai | H10K 59/122 349/156 |
| 2022/0052135 | A1* | 2/2022 | Heo | G09G 3/32 |
| 2022/0173352 | A1 | 6/2022 | Kwak | |
| 2022/0181399 | A1 | 6/2022 | Shim | |
| 2023/0354658 | A1* | 11/2023 | You | H10K 59/131 |
| 2024/0081101 | A1* | 3/2024 | Shin | G09G 3/3233 |

FOREIGN PATENT DOCUMENTS

| | | |
|---|---|---|
| KR | 10-2022-0076082 | 6/2022 |
| KR | 10-2022-0080492 | 6/2022 |

* cited by examiner

*Primary Examiner* — Christopher A Johnson
(74) *Attorney, Agent, or Firm* — HARNESS, DICKEY & PIERCE, P.L.C.

(57) ABSTRACT

A display apparatus includes a substrate including a display area and a non-display area outside the display area, a pixel circuit layer disposed on the substrate and including at least one transistor, a first sub-pixel electrode, a second sub-pixel electrode, and a third sub-pixel electrode spaced apart from each other and disposed on the pixel circuit layer, a first conductive bank layer disposed on the first sub-pixel electrode and including a first opening overlapping the first sub-pixel electrode, a second conductive bank layer disposed on the second sub-pixel electrode and including a second opening overlapping the second sub-pixel electrode, and a third conductive bank layer disposed on the third sub-pixel electrode and including a third opening overlapping the third sub-pixel electrode, wherein the first conductive bank layer, the second conductive bank layer, and the third conductive bank layer are spaced apart from each other.

20 Claims, 13 Drawing Sheets

FIG. 6

DISPLAY APPARATUS

CROSS-REFERENCE TO RELATED APPLICATION(S)

This application claims priority to and benefits of Korean Patent Application No. 10-2023-0039295 under 35 U.S.C. § 119, filed on Mar. 24, 2023, in the Korean Intellectual Property Office, the entire contents of which are incorporated herein by reference.

BACKGROUND

1. Technical Field

One or more embodiments relate to a display apparatus.

2. Description of the Related Art

A display apparatus visually displays data. The display apparatus may provide an image by using light-emitting diodes. Recently, the usage of display apparatuses has diversified. Accordingly, various designs for display apparatuses have been attempted to improve the quality of the display apparatuses.

SUMMARY

One or more embodiments provide a display apparatus capable of improving image resolution and capable of displaying images having excellent quality.

However, embodiments of the disclosure are not limited to those set forth herein. The above and other embodiments will become more apparent to one of ordinary skill in the art to which the disclosure pertains by referencing the detailed description of the disclosure given below.

According to one or more embodiments, a display apparatus may include a substrate including a display area and a non-display area outside the display area, a pixel circuit layer disposed on the substrate and including at least one transistor, a first sub-pixel electrode, a second sub-pixel electrode, and a third sub-pixel electrode spaced apart from each other and disposed on the pixel circuit layer in the display area, a first conductive bank layer disposed on the first sub-pixel electrode and including a first opening overlapping the first sub-pixel electrode, a second conductive bank layer disposed on the second sub-pixel electrode and including a second opening overlapping the second sub-pixel electrode, and a third conductive bank layer disposed on the third sub-pixel electrode and including a third opening overlapping the third sub-pixel electrode, wherein the first conductive bank layer, the second conductive bank layer, and the third conductive bank layer are spaced apart from each other.

In an embodiment, each of the first conductive bank layer, the second conductive bank layer, and the third conductive bank layer may have an island shape.

In an embodiment, the display apparatus may further include an auxiliary line disposed in the display area on the substrate, electrically connected to the first conductive bank layer through a first contact hole, electrically connected to the second conductive bank layer through a second contact hole, and electrically connected to the third conductive bank layer through a third contact hole.

In an embodiment, the auxiliary line has a mesh shape.

In an embodiment, the display apparatus may further include a first connection conductive layer disposed on the pixel circuit layer and electrically connected to the transistor.

In an embodiment, the display apparatus may further include a second connection conductive layer disposed on the first connection conductive layer and electrically connected to the first connection conductive layer, wherein the auxiliary line and the second connection conductive layer may be disposed on a same layer.

In an embodiment, the auxiliary line and the first connection conductive layer may be disposed on a same layer.

In an embodiment, the display apparatus may further include an organic insulating layer disposed between the pixel circuit layer and the first to third sub-pixel electrodes in the display area and extending from the display area to the non-display area, a fourth conductive bank layer disposed on the organic insulating layer in the non-display area, and a common power supply line disposed in the non-display area and electrically connected to the auxiliary line to supply a common voltage, wherein the fourth conductive bank layer may be electrically insulated from the common power supply line.

In an embodiment, the display apparatus may further include a first intermediate layer disposed on the first sub-pixel electrode in the first opening of the first conductive bank layer, and a first opposite electrode disposed on the first intermediate layer, wherein the auxiliary line may be electrically connected to the first opposite electrode.

In an embodiment, the auxiliary line may be configured to transfer a common voltage.

In an embodiment, a width between an inner side surface and an outer side surface of the first conductive bank layer may be less than a width of the first opening of the first conductive bank layer.

In an embodiment, a distance between the first conductive bank layer and the second conductive bank layer may be greater than a width between an inner side surface and an outer side surface of the first conductive bank layer.

In an embodiment, each of the first conductive bank layer, the second conductive bank layer, and the third conductive bank layer may include a lower conductive layer and an upper conductive layer disposed on the lower conductive layer, and the lower conductive layer and the upper conductive layer may include conductive materials having different etch selectivities.

According to one or more embodiments, a display apparatus may include a substrate including a display area and a non-display area outside the display area, a plurality of sub-pixel electrodes spaced apart from each other in the display area of the substrate, a plurality of conductive bank layers respectively disposed on the plurality of sub-pixel electrodes and including openings respectively overlapping the plurality of sub-pixel electrodes, and an auxiliary line disposed between the substrate and the plurality of conductive bank layers and electrically connected to each of the plurality of conductive bank layers, wherein the plurality of conductive bank layers are spaced apart from each other, the display area may include a first region in which the plurality of conductive bank layers are disposed and a second region outside the first region, and a size of the first region is less than a size of the second region.

In an embodiment, the second region may not overlap the plurality of conductive bank layers.

In an embodiment, at least a portion of the auxiliary line may be disposed between adjacent sub-pixel electrodes among the plurality of sub-pixel electrodes in a plan view.

In an embodiment, each of the plurality of conductive bank layers may include a lower conductive layer and an upper conductive layer disposed on the lower conductive layer, and the lower conductive layer and the upper conductive layer may include conductive materials having different etch selectivities.

According to one or more embodiments, a display apparatus may include a first sub-pixel, a second sub-pixel, and a third sub-pixel, which emit light of different colors, respectively. The display apparatus may include each of a first unit pixel area and a second unit pixel area including at least one first sub-pixel, at least one second sub-pixel, and at least one third sub-pixel, a first conductive bank layer disposed in the first unit pixel area and including openings respectively overlapping a first sub-pixel electrode of the first sub-pixel, a second sub-pixel electrode of the second sub-pixel, and a third sub-pixel electrode of the third sub-pixel in the first unit pixel area, and a second conductive bank layer disposed in the second unit pixel area and including openings respectively overlapping the first sub-pixel electrode of the first sub-pixel, the second sub-pixel electrode of the second sub-pixel, and the third sub-pixel electrode of the third sub-pixel in the second unit pixel area, wherein the first conductive bank layer and the second conductive bank layer may be spaced apart from each other.

In an embodiment, the display apparatus may further include an auxiliary line electrically connected to the first conductive bank layer through a first contact hole and electrically connected to the second conductive bank layer through a second contact hole.

In an embodiment, each of the first conductive bank layer and the second conductive bank layer may further include an exhaust opening between the first sub-pixel and the third sub-pixel.

In an embodiment each of the first conductive bank layer and the second conductive bank layer may include a lower conductive layer and an upper conductive layer disposed on the lower conductive layer and having an etch selectivity different from that of the lower conductive layer.

BRIEF DESCRIPTION OF THE DRAWINGS

The above and other aspects, features, and advantages of certain embodiments will be more apparent from the following description taken in conjunction with the accompanying drawings, in which:

FIG. 6 is a schematic cross-sectional view of a display apparatus according to an embodiment;

DETAILED DESCRIPTION OF THE EMBODIMENTS

Figure 1A:
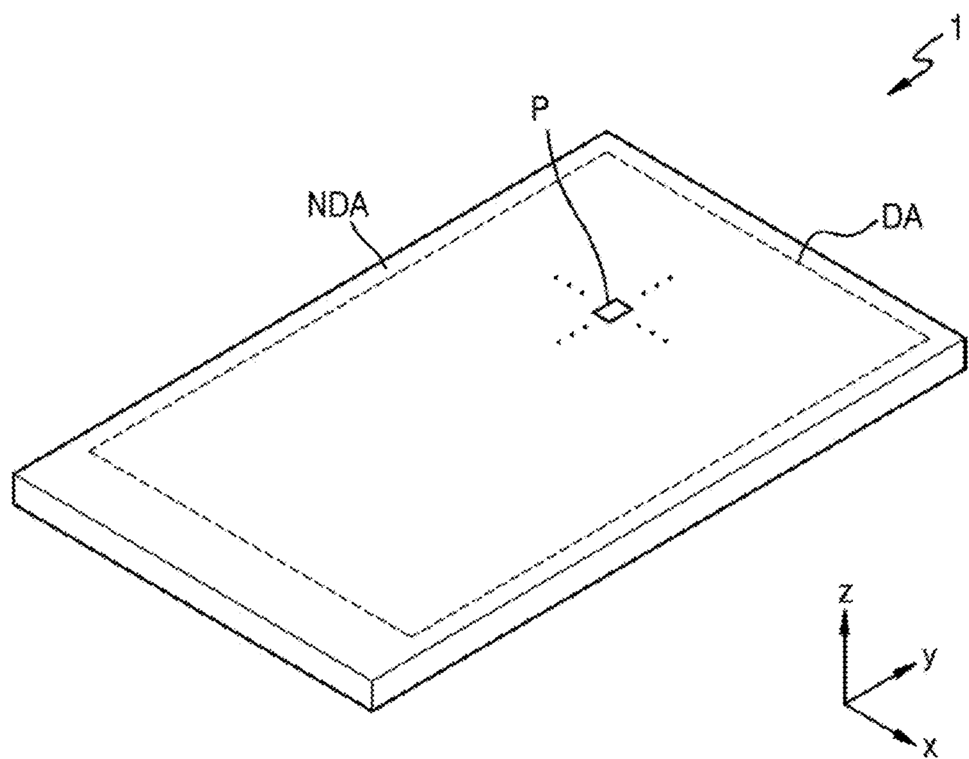
FIGS. 1A and 1B are schematic perspective views of a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z axes, and may be interpreted in a broader sense. For example, the x-axis, the y-axis, and the z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of described features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Figure 1B:
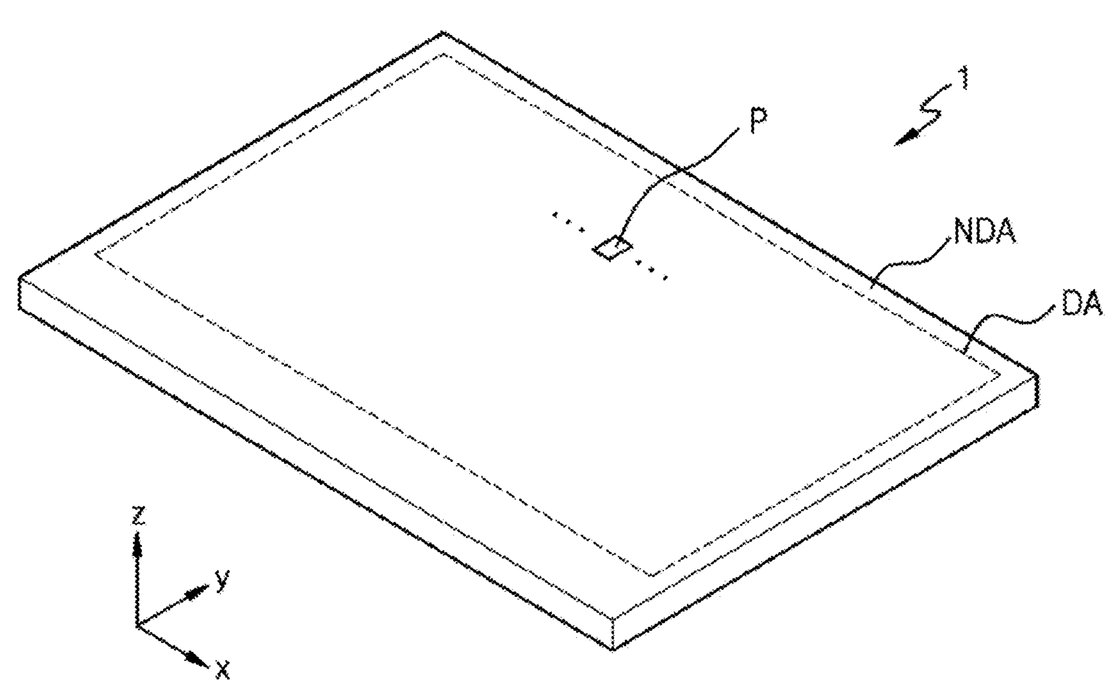

FIGS. 1A and 1B are schematic perspective views of a display apparatus 1 according to an embodiment.

Referring to FIGS. 1A and 1B, the display apparatus 1 may include a display area DA and a non-display area NDA outside the display area DA. A planar shape of the display apparatus 1 may be the same as a planar shape of a substrate 100 described with reference to FIG. 4. Accordingly, the display apparatus 1 including the display area DA and the non-display area NDA may indicate that the substrate 100 (refer to FIG. 4) includes the display area DA and the non-display area NDA.

The display area DA may display an image through sub-pixels P disposed in the display area DA. The non-display area NDA may be a non-display area which is disposed outside the display area DA and does not display an image, and may surround (e.g., entirely surround) the display area DA. A driver or the like for providing electrical signals or power to the display area DA may be disposed in the non-display area NDA. A pad, which is an area to which an electronic device or a printed circuit board may be electrically connected, may be disposed in the non-display arca NDA.

Sub-pixels P may be disposed in the display area DA. Each of the sub-pixels P may include a display element. The display element may be connected to a sub-pixel circuit that drives the sub-pixel P. In an embodiment, the display element may be a light-emitting diode LED (refer to FIG. 2A). Each sub-pixel P may emit, for example, red light, green light, blue light, or white light through the light-emitting diode LED.

In an embodiment, FIG. 1A shows that the display area DA is a polygon (e.g., a rectangle) in which a length in an x-axis direction is less than a length in a y-axis direction, but in another example, FIG. 1B shows that the display area DA is a polygon (e.g., a rectangle) in which the length in the y-axis direction is less than the length in the x-axis direction. FIGS. 1A and 1B show that the display area DA is substantially rectangular, but embodiments are not limited thereto. In another example, the display area DA may have various shapes, such as an N-polygonal shape (where N is a natural number of 3 or more), a circular shape, or an elliptical shape. FIGS. 1A and 1B show that a corner portion of the display area DA has a shape including a vertex where straight lines meet, but in another example, the display area DA may have a polygonal shape with round corner portions.

Hereinafter, for convenience of explanation, a case where the display apparatus 1 is a smartphone is described, but the display apparatus 1 is not limited thereto. The display apparatus 1 may be a portable electronic device, such as a mobile phone, a smartphone, a table personal computer (PC), a mobile communication terminal, an electronic notebook, an electronic book, a portable multimedia player (PMP), a navigation device, an Ultra Mobile PC (UMPC), or the like, and may also be used in various products, such as a television, a laptop computer, a monitor, an advertisement board, an Internet of things (IoT) device, or the like. For example, the display apparatus 1 according to an embodiment may be used as a wearable device, such as a smart watch, a watch phone, a glasses-type display, and a head mounted display (HMD). Also, the display apparatus 1 according to an embodiment may be applied to a dashboard of a vehicle, a center fascia of a vehicle or a center information display (CID) disposed on a dashboard, a rear-view mirror display replacing a side mirror of a vehicle, and a display screen disposed on a back surface of a front seat as entertainment for a passenger in a back seat of a vehicle.

Figure 2A:
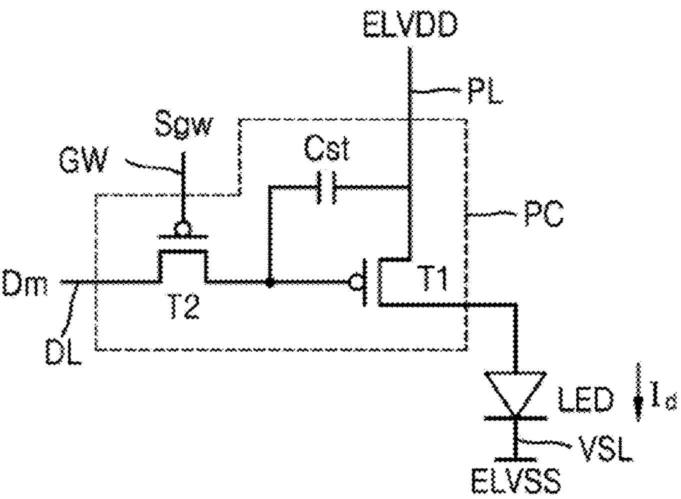
FIGS. 2A and 2B are schematic diagrams of equivalent circuits of a light-emitting diode of a representative sub-pixel of a display apparatus according to an embodiment and a sub-pixel circuit electrically connected to the light-emitting diode.

FIG. 2A is a schematic diagram of an equivalent circuit of a light-emitting diode LED of a representative sub-pixel of a display apparatus according to an embodiment and a sub-pixel circuit PC electrically connected to the light-emitting diode LED.

Referring to FIG. 2A, the light-emitting diode LED may be electrically connected to the sub-pixel circuit PC, and the sub-pixel circuit PC may include a first transistor T1, a second transistor T2, and a storage capacitor Cst. A sub-pixel electrode (e.g., an anode) of the light-emitting diode LED may be electrically connected to the first transistor T1, an opposite electrode (e.g., a cathode) thereof may be electrically connected to an auxiliary line VSL, and may receive a voltage correspond to a common voltage ELVSS through the auxiliary line VSL.

The second transistor T2 may transfer, to the first transistor T1, a data signal Dm input through a data line DL according to a scan signal Sgw input through a scan line GW.

The storage capacitor Cst may be connected to the second transistor T2 and a driving voltage line PL, and may store a voltage corresponding to a difference between a voltage received from the second transistor T2 and a driving voltage ELVDD supplied to the driving voltage line PL.

The first transistor T1 may be connected to the driving voltage line PL and the storage capacitor Cst, and may control a driving current Id flowing from the driving voltage line PL to the light-emitting diode LED, in accordance to a voltage value stored in the storage capacitor Cst. The light-emitting diode LED may emit light having a certain brightness according to the driving current Id.

Although FIG. 2A illustrates that the sub-pixel circuit PC includes two transistors and one storage capacitor, embodiments are not limited thereto.

Figure 2B:
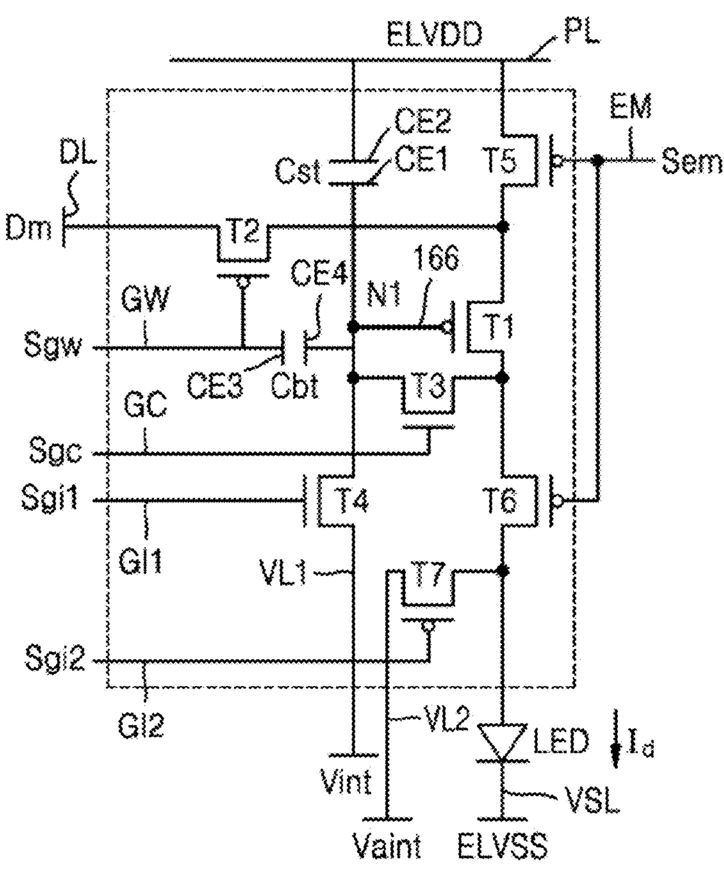

FIG. 2B is a schematic diagram of an equivalent circuit of a light-emitting diode LED of a representative sub-pixel of a display apparatus according to an embodiment and a sub-pixel circuit PC electrically connected to the light-emitting diode LED.

Referring to FIG. 2B, the sub-pixel circuit PC may include seven transistors and two capacitors.

The sub-pixel circuit PC may include first to seventh transistors T1, T2, T3, T4, T5, T6, and T7, a storage capacitor Cst, and a boost capacitor Cbt. In another example, the sub-pixel circuit PC may not include the boost capacitor Cbt. A sub-pixel electrode (e.g., an anode) of the light-emitting diode LED may be electrically connected to the first transistor T1 via the sixth transistor T6, an opposite electrode (e.g., a cathode) thereof may be electrically connected to the auxiliary line VSL and may receive a voltage corresponding to the common voltage ELVSS via the auxiliary line VSL.

Some of the first to seventh transistors T1, T2, T3, T4, T5, T6, and T7 may be n-channel metal-oxide-semiconductor field-effect transistors (MOSFET) (NMOS), and the remaining may be p-channel MOSFETs (PMOSs). In an embodiment, as shown in FIG. 2B, the third and fourth transistors T3 and T4 may be NMOSs, and the remaining may be PMOSs. For example, the third and fourth transistors T3 and T4 may be NMOSs, and may include an oxide-based semiconductor material. The remaining transistors may be PMOSs, and may include a silicon-based semiconductor material. In another example, the third, fourth, and seventh transistors T3, T4, and T7 may be NMOSs, and the remaining transistors may be PMOSs.

The first to seventh transistors T1, T2, T3, T4, T5, T6, and T7, the storage capacitor Cst, and the boost capacitor Cbt may be connected to a signal line. The signal line may include the scan line GW, an emission control line EM, a compensation gate line GC, a first initialization gate line G11, a second initialization gate line G12, and the data line DL. The sub-pixel circuit PC may be electrically connected to a voltage line, for example, the driving voltage line PL, a first initialization voltage line VL1, and a second initialization voltage line VL2.

The first transistor T1 may be a driving transistor. A first gate electrode of the first transistor T1 may be connected to the storage capacitor Cst, a first electrode of the first transistor T1 may be electrically connected to the driving voltage line PL via the fifth transistor T5, and a second electrode of the first transistor T1 may be electrically connected to a first electrode (e.g., an anode) of the light-emitting diode LED via the sixth transistor T6. One of the first electrode and the second electrode of the first transistor T1 may be a source electrode, and another one of the first electrode and the second electrode of the first transistor T1 may be a drain electrode. The first transistor T1 may supply the driving current Id to the light-emitting diode LED according to a switching operation of the second transistor T2.

The second transistor T2 may be a switching transistor. A second gate electrode of the second transistor T2 may be connected to the scan line GW, a first electrode of the second transistor T2 may be connected to the data line DL, and a second electrode of the second transistor T2 may be electrically connected to the driving voltage line PL via the fifth transistor T5, which is connected to the first electrode of the first transistor T1. One of the first electrode and the second electrode of the second transistor T2 may be a source electrode, and another one of the first electrode and the second electrode of the second transistor T2 may be a drain electrode. The second transistor T2 may be turned on according to the scan signal Sgw received through the scan line GW, and may perform a switching operation of delivering/transferring a data signal Dm delivered/transferred to the data line DL to the first electrode of the first transistor T1.

The third transistor T3 may be a compensation transistor that compensates for a threshold voltage of the first transistor T1. A third gate electrode of the third transistor T3 may be connected to the compensation gate line GC. A first electrode of the third transistor T3 may be connected to a lower electrode CE1 of the storage capacitor Cst and the first gate electrode of the first transistor T1 through a node connection line 166. The first electrode of the third transistor T3 may be connected to the fourth transistor T4. A second electrode of the third transistor T3 may be electrically connected to the first electrode (e.g., an anode) of the light-emitting diode LED via the sixth transistor T6, which is connected to the second electrode of the first transistor T1. One of the first electrode and the second electrode of the third transistor T3 may be a source electrode, and another one of the first electrode and the second electrode of the third transistor T3 may be a drain electrode.

The third transistor T3 may be turned on according to a compensation signal Sgc received through the compensation gate line GC to electrically connect the first gate electrode and the second electrode (e.g., a drain electrode) of the first transistor T1 to each other to diode-connect the first transistor T1.

The fourth transistor T4 may be a first initialization transistor that initializes the first gate electrode of the first transistor T1. A fourth gate electrode of the fourth transistor T4 may be connected to the first initialization gate line G11. A first electrode of the fourth transistor T4 may be connected to the first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and another one of the first electrode and the second electrode of the fourth transistor T4 may be a drain electrode. The fourth transistor T4 may be turned on according to a first initialization signal Sgi1 received through the first initialization gate line G11 that transmits a first initialization voltage Vint to the first gate electrode of the first transistor T1 to perform an initialization operation of initializing a voltage of the first gate electrode of the first transistor T1.

The fifth transistor T5 may be an operation control transistor. A fifth gate electrode of the fifth transistor T5 may be connected to the emission control line EM, a first electrode of the fifth transistor T5 may be connected to the driving voltage line PL, and a second electrode of the fifth transistor T5 may be connected to the first electrode of the first transistor T1 and the second electrode of the second transistor T2. One of the first electrode and the second electrode of the fifth transistor T5 may be a source electrode, and another one of the first electrode and the second electrode of the fifth transistor T5 may be a drain electrode.

The sixth transistor T6 may be an emission control transistor. A sixth gate electrode of the sixth transistor T6 may be connected to the emission control line EM, a first electrode of the sixth transistor T6 may be connected to the second electrode of the first transistor T1 and the second electrode of the third transistor T3, and a second electrode of the sixth transistor T6 may be electrically connected to a second electrode of the seventh transistor T7 and the first electrode (e.g., an anode) of the light-emitting diode LED. One of the first electrode and the second electrode of the sixth transistor T6 may be a source electrode, and another one of the first electrode and the second electrode of the sixth transistor T6 may be a drain electrode.

The fifth transistor T5 and the sixth transistor T6 may be simultaneously turned on according to an emission control signal Sem received through the emission control line EM to allow the driving voltage ELVDD to be transmitted to the light-emitting diode LED, and the driving current Id may flow through the light-emitting diode LED.

The seventh transistor T7 may be a second initialization transistor that initializes the first electrode (e.g., an anode) of the light-emitting diode LED. A seventh gate electrode of the seventh transistor T7 may be connected to the second initialization gate line G12. A first electrode of the seventh transistor T7 may be connected to the second initialization voltage line VL2. The second electrode of the seventh transistor T7 may be connected to the second electrode of the sixth transistor T6 and the first electrode (e.g., an anode) of the light-emitting diode LED. The seventh transistor T7 may be turned on according to a second initialization signal Sgi2 received through the second initialization gate line G12, and may transmit a second initialization voltage Vaint to the first electrode (e.g., an anode) of the light-emitting diode LED to initialize the first electrode of the light-emitting diode LED.

In some embodiments, the second initialization voltage line VL2 may be a subsequent scan line. For example, the second initialization gate line G12 connected to the seventh transistor T7 of the sub-pixel circuit PC disposed in the i-th row (wherein i is a natural number) may correspond to a scan line of a sub-pixel circuit PC disposed in the (i+1)-th row. In another example, the second initialization voltage line VL2 may be the emission control line EM. For example, the emission control line EM may be electrically connected to the fifth to seventh transistors T5, T6, and T7.

The storage capacitor Cst may include the lower electrode CE1 and an upper electrode CE2. The lower electrode CE1 of the storage capacitor Cst may be connected to the first gate electrode of the first transistor T1, and the upper electrode CE2 of the storage capacitor Cst may be connected to the driving voltage line PL. The storage capacitor Cst may store a charge corresponding to a difference between a voltage of the first gate electrode of the first transistor T1 and the driving voltage ELVDD.

The boost capacitor Cbt may include a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. In case that the scan signal Sgw supplied to the scan line GW is turned off, the boost capacitor Cbt may increase a voltage of a first node N1, and in case that the voltage of the first node N1 is increased, a black gradation may be clearly expressed.

The first node N1 may be an area to which the first gate electrode of the first transistor T1, the first electrode of the third transistor T3, the second electrode of the fourth transistor T4, and the fourth electrode CE4 of the boost capacitor Cbt are connected.

In an embodiment, it is described in FIG. 2B that the third and fourth transistors T3 and T4 are NMOSs, and the first, second, and fifth to seventh transistors T1, T2, T5, T6, and T7 are PMOSs. The first transistor T1, which directly affects the brightness of a display apparatus displaying images, may include a semiconductor layer including polycrystalline silicon having high reliability, thereby implementing a display apparatus having high resolution.

Although FIG. 2B illustrates that some transistors are NMOSs and others are PMOSs, embodiments are not limited thereto. In another example, the sub-pixel circuit PC may include three transistors, and various modifications may be made, for example, all of the three transistors are NMOSs.

Figure 3A:
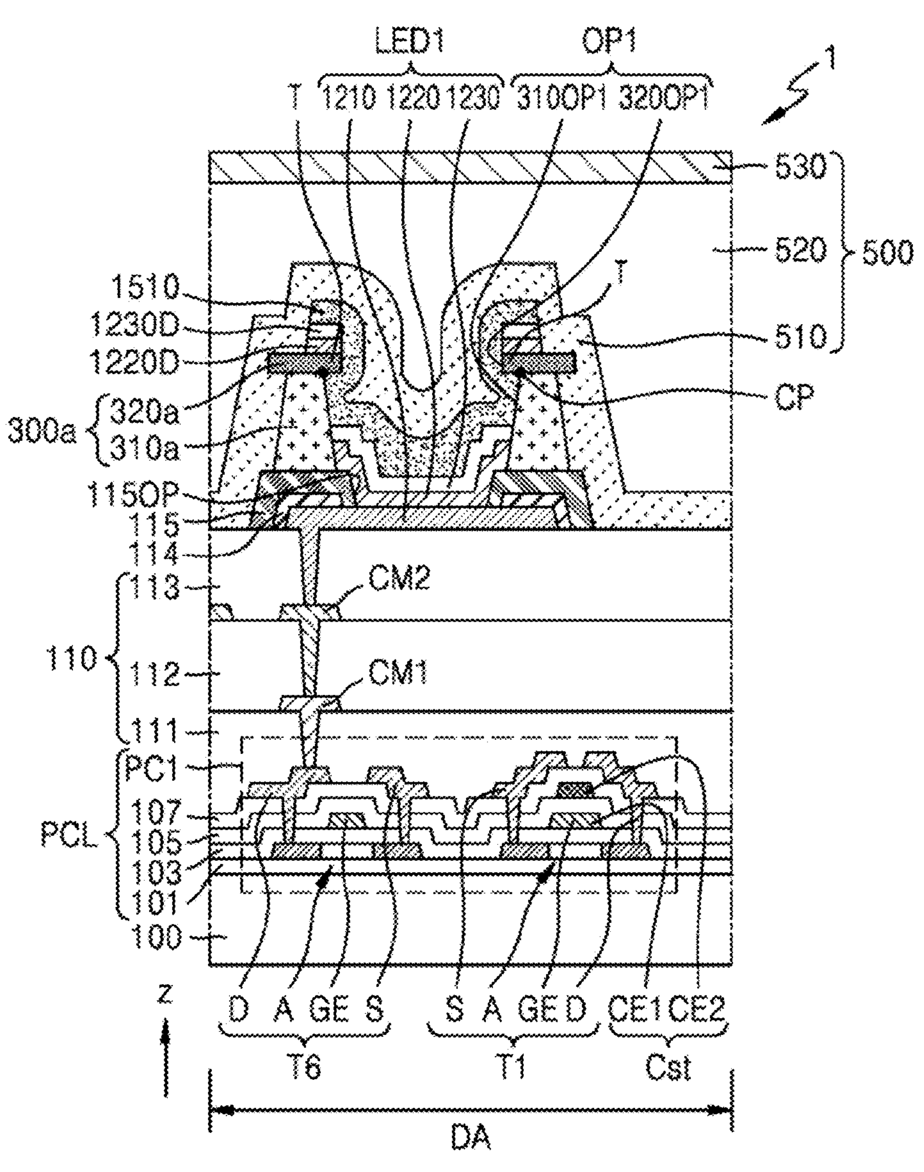
FIG. 3A is a schematic cross-sectional view of a display apparatus according to an embodiment.
Figure 3B:
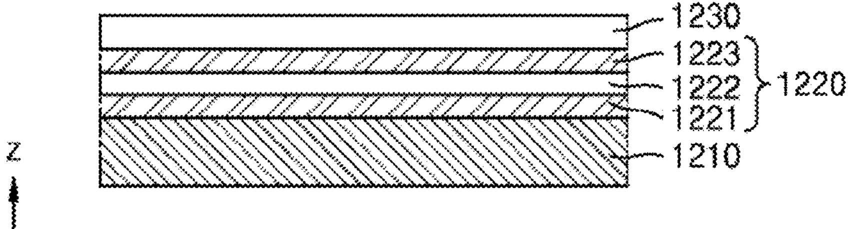
FIG. 3B is a schematic cross-sectional view of a stacked structure of a first light-emitting diode included in a display apparatus according to an embodiment.

FIG. 3A is a schematic cross-sectional view of the display apparatus 1 according to an embodiment. FIG. 3A illustrate a partial structure including a first light-emitting diode LED1 in the display apparatus 1. FIG. 3B is a schematic cross-sectional view of a stacked structure of the first light-emitting diode LED1 included in the display apparatus 1 according to an embodiment.

Referring to FIG. 3A, the display apparatus 1 may include the substrate 100, a pixel circuit layer PCL on the substrate 100, an organic insulating layer 110 on the pixel circuit layer PCL, the first light-emitting diode LED1 on the organic insulating layer 110, a first conductive bank layer 300*a* on the organic insulating layer 110, and an encapsulation layer 500 on the first light-emitting diode LED1.

The display area DA of the display apparatus 1 may include the first light-emitting diode LED1 disposed on the substrate 100. The first light-emitting diode LED1 may include a first sub-pixel electrode 1210, a first intermediate layer 1220 on the first sub-pixel electrode 1210, and a first opposite electrode 1230 on the first intermediate layer 1220, and may emit light of a first color.

The substrate 100 may include a glass material or a polymer resin. The substrate 100 may include a structure in which a base layer including a polymer resin and an inorganic barrier layer are stacked. The polymer resin may be polyethersulfone (PES), polyarylate (PAR), polyetherimide (PEI), polyethylene naphthalate (PEN), polyethylene terephthalate (PET), polyphenylene sulfide (PPS), polyallylate, polyimide (PI), polycarbonate, cellulose triacetate (TAC), or cellulose acetate propionate (CAP).

The pixel circuit layer PCL including at least one transistor may be disposed on the substrate 100. The pixel circuit layer PCL may include a buffer layer 101, a first gate insulating layer 103, a first interlayer insulating layer 105, a second interlayer insulating layer 107, transistors and a storage capacitor Cst of a first sub-pixel circuit PC1.

The buffer layer 101 may be disposed on an upper surface of the substrate 100. The buffer layer 101 may prevent impurities from penetrating into a semiconductor layer of a transistor. The buffer layer 101 may include an inorganic insulating material, such as silicon nitride, silicon oxynitride, and silicon oxide, and may include a single layer or a multilayer, each including the inorganic insulating material described above.

The first sub-pixel circuit PC1 may be disposed between the substrate 100 and the first light-emitting diode LED1 to be electrically connected to the first light-emitting diode LED1. The first sub-pixel circuit PC1 may include the transistors and the storage capacitor as described above with reference to FIGS. 2A and 2B. In an embodiment, FIG. 3A illustrates the first transistor T1, the sixth transistor T6, and the storage capacitor Cst of the sub-pixel circuit PC of FIG. 2B.

Each of the first transistor T1 and the sixth transistor T6 may include a semiconductor layer A on the buffer layer 101 and a gate electrode GE overlapping a channel area of the semiconductor layer A. The semiconductor layer A may include a silicon-based semiconductor material, for example, polysilicon. The semiconductor layer A may include the channel arca, a first area, and a second area. For example, the first area and the second area may be respectively disposed on sides (e.g., opposite sides) of the channel area. The first area and the second arca may each be an area including a higher concentration of impurities than that of the channel area, and any one of the first area and the second area may be a source area, and another one of the first area and the second area may correspond to a drain area.

The gate electrode GE may include a conductive material including molybdenum (Mo), aluminum (Al), copper (Cu), titanium (Ti), or the like, and may include a single layer or a multilayer that includes the material described above. The first gate insulating layer 103 for electrical insulation from the semiconductor layer A may be disposed below the gate electrode GE. The first gate insulating layer 103 may include an inorganic insulating material, such as silicon nitride, silicon oxynitride, and silicon oxide, and may include a single layer or a multilayer that includes the inorganic insulating material described above.

The storage capacitor Cst may include the lower electrode CE1 and the upper electrode CE2, which overlap each other. In an embodiment, the lower electrode CE1 of the storage capacitor Cst may include the gate electrode GE of the first transistor T1. For example, the gate electrode GE of the first transistor T1 may include the lower electrode CE1 of the storage capacitor Cst. For example, the gate electrode GE of the first transistor T1 and the lower electrode CE1 of the storage capacitor Cst may be an integral body (or a single body).

The first interlayer insulating layer 105 may be disposed between the lower electrode CE1 and the upper electrode CE2 of the storage capacitor Cst. The first interlayer insulating layer 105 may include an inorganic insulating material, such as silicon oxide, silicon nitride, and silicon oxynitride, and may include a single-layered structure or a multi-layered structure that includes the above inorganic insulating material.

The upper electrode CE2 of the storage capacitor Cst may include a low-resistance conductive material, such as Mo, Al, Cu, and/or Ti, and may include a single-layered structure or a multi-layered structure that includes the above material.

The second interlayer insulating layer 107 may be disposed on the storage capacitor Cst. The second interlayer insulating layer 107 may include an inorganic insulating material, such as silicon oxide, silicon nitride, and silicon oxynitride, and may include a single-layered structure or multi-layered structure that includes the above inorganic insulating material.

A source electrode S and/or drain electrode D electrically connected to the semiconductor layer A of each of the first transistor T1 and the sixth transistor T6 may be disposed on the second interlayer insulating layer 107. The source electrode S and the drain electrode D may include Al, Cu, and/or Ti, and may include a single layer or a multilayer that includes the above material.

The organic insulating layer 110 may be disposed on the pixel circuit layer PCL. The organic insulating layer 110 may include a first organic insulating layer 111 on the pixel circuit layer PCL, a second organic insulating layer 112 on the first organic insulating layer 111, and a third organic insulating layer 113 on the second organic insulating layer 112.

The first organic insulating layer 111 may be disposed between the first sub-pixel circuit PC1 and a first connection conductive layer CM1. The first organic insulating layer 111 may include an organic insulating material, such as acrylic, benzocyclobutene (BCB), polyimide, or hexamethyldisiloxane (HMDSO).

The display apparatus 1 may further include the first connection conductive layer CM1 and a second connection conductive layer CM2. The first connection conductive layer CM1 may be disposed on the first organic insulating layer 111. The first connection conductive layer CM1 may be disposed between the first organic insulating layer 111 and the second organic insulating layer 112. The first connection conductive layer CM1 may be disposed on the pixel circuit layer PCL, and may be electrically connected to a transistor of the pixel circuit layer PCL. The first connection conductive layer CM1 may be connected (for example, directly connected) to the transistor of the pixel circuit layer PCL through a contact hole of the first organic insulating layer 111. For example, the first connection conductive layer CM1 may be connected to the sixth transistor T6 of the first sub-pixel circuit PC1. The first connection conductive layer CM1 may include Al, Cu, and/or Ti, and may include a single layer or a multilayer that includes the above material.

The second organic insulating layer 112 may be disposed on the first organic insulating layer 111. The second organic insulating layer 112 may be disposed between the first connection conductive layer CM1 and the second connection conductive layer CM2. The second organic insulating layer 112 may include an organic insulating material, such as acrylic, BCB, polyimide, or HMDSO.

Figure 6:
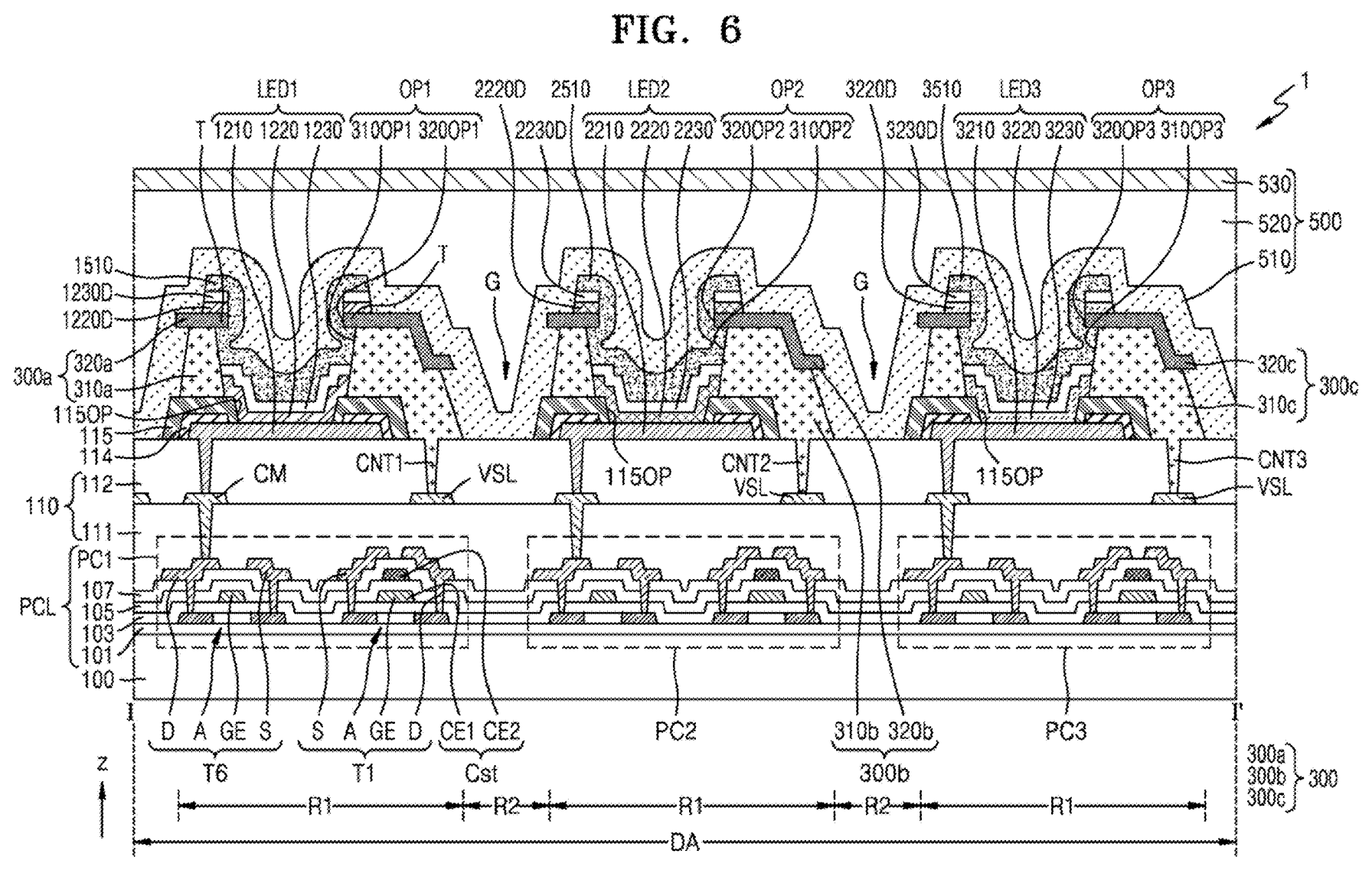

The second connection conductive layer CM2 may be disposed on the second organic insulating layer 112. The second connection conductive layer CM2 may be disposed on an upper portion of the first connection conductive layer CM1. The second connection conductive layer CM2 may be electrically connected to the first connection conductive layer CM1. The second connection conductive layer CM2 may include Al, Cu, and/or Ti, and may include a single layer or a multilayer that includes the above material. In some embodiments, as shown in FIG. 6, the second connection conductive layer CM2 may be omitted, and the third organic insulating layer 113 may be disposed between the second connection conductive layer CM2 and the first sub-pixel electrode 1210. The third organic insulating layer 113 may include an organic insulating material, such as acrylic, BCB, polyimide, or HMDSO.

The first sub-pixel electrode 1210 of the first light-emitting diode LED1 may be disposed on the organic insulating layer 110. In an embodiment, the first sub-pixel electrode 1210 may be disposed on the third organic insulating layer 113.

The first sub-pixel electrode 1210 may include a transparent electrode (or semi-transparent electrode) of a reflective electrode. In case that the first sub-pixel electrode 1210 is a transparent electrode (or semi-transparent electrode), the first sub-pixel electrode 1210 may include, for example, indium tin oxide (ITO), indium zinc oxide (IZO), zinc oxide (ZnO), indium oxide (In203), indium gallium oxide (IGO), or aluminum zinc oxide (AZO), and in case that the first sub-pixel electrode 1210 is a reflective electrode, the first sub-pixel electrode 1210 may include a reflective film including Ag, Mg, Al, Pt, Pd, Au, Ni, Nd, Ir, Cr, a compound thereof, or the like, and may further include a film including ITO, IZO, ZnO, or In203 on the reflective film. In an embodiment, the first sub-pixel electrode 1210 may have a structure in which an ITO layer, an Ag layer, and an ITO layer are sequentially stacked.

The first sub-pixel electrode 1210 may be electrically connected to the second connection conductive layer CM2 through a contact hole of the third organic insulating layer 113. In an embodiment, the first sub-pixel electrode 1210 may be electrically connected to the sixth transistor T6 of the first sub-pixel circuit PC1 through the first connection conductive layer CM1 and the second connection conductive layer CM2.

A protective layer 114 may be disposed on the first sub-pixel electrode 1210. The protective layer 114 may overlap an outer side portion of the first sub-pixel electrode 1210, and may include an opening overlapping an inner side portion of the first sub-pixel electrode 1210. In the description, "an outer side portion of A" refers to "a portion of A, the portion including an edge portion of A." and "an inner side portion of A" refers to "another portion of A, the other portion being surround by the above outer side portion (or a peripheral portion)."

The protective layer 114 may prevent the first sub-pixel electrode 1210 from being damaged by a gas or liquid material used in various etching operations/processes or ashing operations/processes included in an operation/process of manufacturing a display apparatus. The protective layer 114 may include a conductive oxide, such as ITO, IZO, indium gallium zinc oxide (IGZO), indium tin zinc oxide (ITZO), ZnO, aluminum doped zinc oxide (AZO), gallium doped zinc oxide (GZO), zinc tin oxide (ZTO), gallium tin oxide (GTO), fluorine doped tin oxide (FTO), or the like.

The protective layer 114 may pass through an edge portion of the first sub-pixel electrode 1210 to be in contact with an insulating layer disposed below the first sub-pixel electrode 1210, for example, an upper surface of the third organic insulating layer 113. In another example, the protective layer 114 may not pass through the edge portion of the first sub-pixel electrode 1210 and may not extend to the upper surface of the third organic insulating layer 113 below the first sub-pixel electrode 1210. For example, an edge portion of the protective layer 114 and the edge portion of the first sub-pixel electrode 1210 may be positioned on substantially the same line (e.g., a vertical line).

A first conductive bank layer 300*a* may be disposed above the first sub-pixel electrode 1210 with an insulating layer 115 between first conductive bank layer 300*a* and the first sub-pixel electrode 1210. The first conductive bank layer 300*a* may include a first opening OP1 penetrating (or passing through) the first conductive bank layer 300*a* in a thickness direction of the first conductive bank layer 300*a*. The first opening OP1 of the first conductive bank layer 300*a* may overlap the first sub-pixel electrode 1210.

The first opening OP1 may penetrate from an upper surface to a bottom surface of the first conductive bank layer 300*a*, and may have an undercut cross-sectional structure.

The first opening OP1 may include a first opening portion 3100P1 penetrating (or passing through) a first lower conductive layer 310*a* and a second opening portion 320OP1 penetrating (or passing through) a first upper conductive layer 320*a*. The first opening portion 310OP1 of the first opening OP1 may be referred to as an opening of the first lower conductive layer 310*a*, and the second opening portion 3200P1 of the first opening OP1 may be referred to as an opening of the first upper conductive layer 320*a*. The first opening portion 3100P1 of the first opening OP1 may overlap the first sub-pixel electrode 1210 and the protective layer 114. The second opening portion 3200P1 of the first opening OP1 may overlap the first sub-pixel electrode 1210 and the protective layer 114.

The first opening portion 3100P1 and the second opening portion 3200P1 of the first opening OP1 may overlap each other and may be connected to each other. A width of the first opening portion 3100P1 of the first opening OP1 may be greater than a width of the second opening portion 3200P1 of the first opening OP1. The first opening portion 3100P1 of the first lower conductive layer 310*a* may have a shape in which a width thereof decreases toward a lower portion of the first lower conductive layer 310*a*. For example, a width of an upper portion of the first opening portion 310OP1 of the first lower conductive layer 310*a* may be greater than a width of a lower portion of the first opening portion 310OP1. For example, a side surface of the first lower conductive layer 310*a*, the side surface facing the first opening portion 310OP1, may include an inclined surface tapered in a forward direction.

A side surface of the first lower conductive layer 310*a*, the side surface facing the first opening OP1 of the first conductive bank layer 300*a*, may have a tapered shape in the forward direction, and may have an inclined angle that is equal to or greater than about 60° and less than about 90°. The first upper conductive layer 320*a* of the first conductive bank layer 300*a* may include a tip portion T extending toward the first opening OP1. The tip portion T may be a portion of the first upper conductive layer 320*a*, the portion further protruding toward the first opening OP1.

The insulating layer 115 may electrically insulate the first conductive bank layer 300*a* from the first sub-pixel electrode 1210. The insulating layer 115 may be disposed on the protective layer 114. The insulating layer 115 may overlap the first sub-pixel electrode 1210 and the protective layer 114. The insulating layer 115 may cover a side surface of each of the first sub-pixel electrode 1210 and the protective layer 114. The insulating layer 115 may include an inorganic insulating material. In case that the insulating layer 115 includes an inorganic insulating material, decrease (or reduction) in the quality of a light-emitting diode due to gas emitted from an insulating layer, which is an organic insulating material, may be prevented or minimized during an operation/process of manufacturing a display apparatus, as compared with a case where the insulating layer 115 includes an organic insulating material.

The insulating layer 115 may include an inorganic insulating material, such as silicon oxide, silicon nitride, and silicon oxynitride, and may include a single-layered or multi-layered structure that includes the above inorganic insulating material. The insulating layer 115 may include an opening 115OP overlapping the first opening OP1 of the first conductive bank layer 300*a* and the first sub-pixel electrode 1210. A width of the opening 115OP of the insulating layer 115 may be less than a width of the first opening OP1. For example, a width of the opening 115OP of the insulating layer 115 may be less than a width of the first opening portion 310OP1 of the first lower conductive layer 310*a*, and may be less than a width of the second opening portion 3200P1 of the first upper conductive layer 320*a*. In an embodiment, an insulating protective layer may be further included between the first conductive bank layer 300*a* and the insulating layer 115. The insulating protective layer may include an amorphous inorganic insulating material such as silicon oxide and/or silicon nitride.

The first intermediate layer 1220 may be in contact with (e.g., in direct contact with) the first sub-pixel electrode 1210 through the opening 115OP of the insulating layer 115. For example, an inner side portion of the first intermediate layer 1220 may overlap and contact (e.g., directly contact) the first sub-pixel electrode 1210, and an outer side portion thereof may extend onto the insulating layer 115 to overlap and contact (e.g., directly contact) the insulating layer 115. The first intermediate layer 1220 between the first opposite electrode 1230 and the first sub-pixel electrode 1210 may emit light of a first color. A width of the opening 115OP of the insulating layer 115 may correspond to a width of an emission area of the first light-emitting diode LED1.

The first intermediate layer 1220 may include a first emission layer 1222, as shown in FIG. 3B. The first intermediate layer 1220 may include a common layer between the first sub-pixel electrode 1210 and the first emission layer 1222 and/or between the first emission layer 1222 and the first opposite electrode 1230. Hereinafter, a common layer between the first sub-pixel electrode 1210 and the first emission layer 1222 is referred to as a first common layer 1221, and a common layer between the first emission layer 1222 and the first opposite electrode 1230 is referred to as a second common layer 1223.

The first emission layer 1222 may include a polymer organic material or a low-molecular-weight organic material, which emits light of a certain color (red, green, or blue). In another example, the first emission layer 1222 may include an inorganic material or a quantum dot.

The first common layer 1221 may include a hole transport layer (HTL) and/or a hole injection layer (HIL). The second common layer 1223 may include an electron transport layer (ETL) and/or an electron injection layer (EIL). The first common layer 1221 and the second common layer 1223 may each include an organic material.

The first opposite electrode 1230 may include a conductive material having a low work function. For example, the first opposite electrode 1230 may include a transparent layer (or semi-transparent electrode), the transparent layer (or semi-transparent electrode) including silver (Ag), magnesium (Mg), Al, Pt, platinum (Pt), palladium (Pd), gold (Au), nickel (Ni), neodymium (Nd), iridium (Ir), chromium (Cr), lithium (Li), calcium (Ca), alloys thereof, or the like. In another example, the first opposite electrode 1230 may further include a layer, such as ITO, IZO, ZnO, or In203, above the transparent layer (or semi-transparent electrode) including the materials described above.

As shown in FIG. 3A, an inner side portion of the first opposite electrode 1230 may overlap the first intermediate layer 1220 and the first sub-pixel electrode 1210, and an outer side portion thereof may extend onto the insulating layer 115 to overlap the insulating layer 115. An edge portion or the outer side portion of the first opposite electrode 1230 may be in contact with (e.g., in direct contact with) a side surface of the first lower conductive layer 310*a*, the side surface facing the first opening OP1. In an embodiment, a capping layer including an organic material or an inorganic material may be further included between the first opposite electrode 1230 and a first inorganic barrier layer 1510.

The first conductive bank layer 300*a* may include conductive layers having different etch selectivities. In an embodiment, the first conductive bank layer 300*a* may include the first lower conductive layer 310*a* and the first upper conductive layer 320*a* on the first lower conductive layer 310*a*. The first lower conductive layer 310*a* and the first upper conductive layer 320*a* may include metals having different etch selectivities. In an embodiment, the first lower conductive layer 310*a* may be a layer including Al, and the first upper conductive layer 320*a* may be a layer including Ti. FIG. 3A shows that the first conductive bank layer 300*a* includes two conductive layers, but embodiments are not limited thereto. In another example, the first conductive bank layer 300*a* may include the first lower conductive layer 310*a* and the first upper conductive layer 320*a* on the first lower conductive layer 310*a*, and may further include a conductive layer below the first lower conductive layer 310*a*.

A thickness of the first lower conductive layer 310*a* may be formed greater than a thickness of the first upper conductive layer 320*a*. In an embodiment, the thickness of the first lower conductive layer 310*a* may be greater than about 5 times or less than about 10 times of the thickness of the first upper conductive layer 320*a*. In some embodiments, the thickness of the first lower conductive layer 310*a* may be about 6 times or more, about 7 times or more, or about 8 times or more of the thickness of the first upper conductive layer 320*a*. In an embodiment, the thickness of the first lower conductive layer 310*a* may be about 0.5 μm to about 1 μm, and the thickness of the first upper conductive layer 320*a* may be about 0.03 μm to about 0.15 μm.

The first conductive bank layer 300*a* may include an overhang structure. For example, the first upper conductive layer 320*a* of the first conductive bank layer 300*a* may be formed to have an overhang structure by protruding more than the first lower conductive layer 310*a* toward the first opening OP1 of the first conductive bank layer 300*a*. For example, the first upper conductive layer 320*a* may include the tip portion T protruding in a direction (e.g., a direction facing the first opening OP1 or a lateral direction) from a point CP where a bottom surface of the first upper conductive layer 320*a* and a side surface of the first lower conductive layer 310*a* meet.

The first intermediate layer 1220 may be formed by a deposition operation/process, and in case that the first conductive bank layer 300*a* has an overhang structure, a material for forming the first intermediate layer 1220 may be deposited on the first sub-pixel electrode 1210 as shown in FIG. 3A or may also be deposited on an upper surface of the first conductive bank layer 300*a* as shown in FIG. 3A. The material deposited on the first sub-pixel electrode 1210 may correspond to the first intermediate layer 1220, and a material deposited on the upper surface of the first conductive bank layer 300*a* may correspond to a first dummy intermediate layer 1220D.

Similarly to the first intermediate layer 1220, the first opposite electrode 1230 may be formed by a deposition process, and a first dummy opposite electrode 1230D may be disposed on the upper surface of the first conductive bank layer 300*a*. The first dummy opposite electrode 1230D may be disposed on the first dummy intermediate layer 1220D.

The first inorganic barrier layer 1510 may overlap and cover the first light-emitting diode LED1. The first inorganic barrier layer 1510 may include one or more inorganic insulating materials from among aluminum oxide, titanium oxide, tantalum oxide, hafnium oxide, zinc oxide, silicon oxide, silicon nitride, and silicon oxynitride, and may be deposited in the same way as chemical vapor deposition.

The first inorganic barrier layer 1510 may not be separated or disconnected by the overhang structure of the first conductive bank layer 300*a* by having relatively better step coverage than the first intermediate layer 1220 and the first opposite electrode 1230. The first inorganic barrier layer 1510 may continuously overlap and cover the upper and side surfaces of the first conductive bank layer 300*a* and the first light-emitting diode LED1. In an embodiment, the first inorganic barrier layer 1510 may be continuously formed to overlap (or cover) upper and side surfaces of the first dummy opposite electrode 1230D, a side surface of the first dummy intermediate layer 1220D, a side surface of the first upper conductive layer 320*a*, a side surface of the first lower conductive layer 310*a*, and an upper surface of the first opposite electrode 1230.

The first light-emitting diode LED1 may be sealed by the encapsulation layer 500. The encapsulation layer 500 may be disposed (e.g., entirely disposed) on the substrate 100 to cover the organic insulating layer 110 and the first light-emitting diode LED1. The encapsulation layer 500 may include at least one inorganic encapsulation layer and at least one organic encapsulation layer. In an embodiment, FIG. 3A shows that the encapsulation layer 500 includes a first inorganic encapsulation layer 510, an organic encapsulation layer 520 on the first inorganic encapsulation layer 510, and a second inorganic encapsulation layer 530 on the organic encapsulation layer 520.

The first inorganic encapsulation layer 510 and the second inorganic encapsulation layer 530 may each include one or more inorganic materials from among aluminum oxide, titanium oxide, tantalum oxide, hafnium oxide, zinc oxide, silicon oxide, silicon nitride, and silicon oxynitride, and may be deposited in the same way as chemical vapor deposition. The first inorganic encapsulation layer 510 and the second inorganic encapsulation layer 530 may each be a single layer or a multilayer that includes the material described above. The organic encapsulation layer 520 may include a polymer-based material. The polymer-based material may include an acrylic resin, an epoxy resin, polyimide, polyethylene, or the like. In an embodiment, the organic encapsulation layer 520 may include acrylate.

The first inorganic encapsulation layer 510 may be disposed on the first inorganic barrier layer 1510. In an embodiment, the first inorganic encapsulation layer 510 may be continuously formed to overlap (or cover) the upper and side surfaces of the first dummy opposite electrode 1230D, the side surface of the first dummy intermediate layer 1220D, the side surface of the first upper conductive layer 320*a*, the side surface of the first lower conductive layer 310*a*, and the upper surface of the first opposite electrode 1230. The organic encapsulation layer 520 may be disposed on the first inorganic encapsulation layer 510, and may fill at least a portion of the first opening OP1 of the first conductive bank layer 300*a*. The second inorganic encapsulation layer 530 may be disposed on the organic encapsulation layer 520.

Figure 4A:
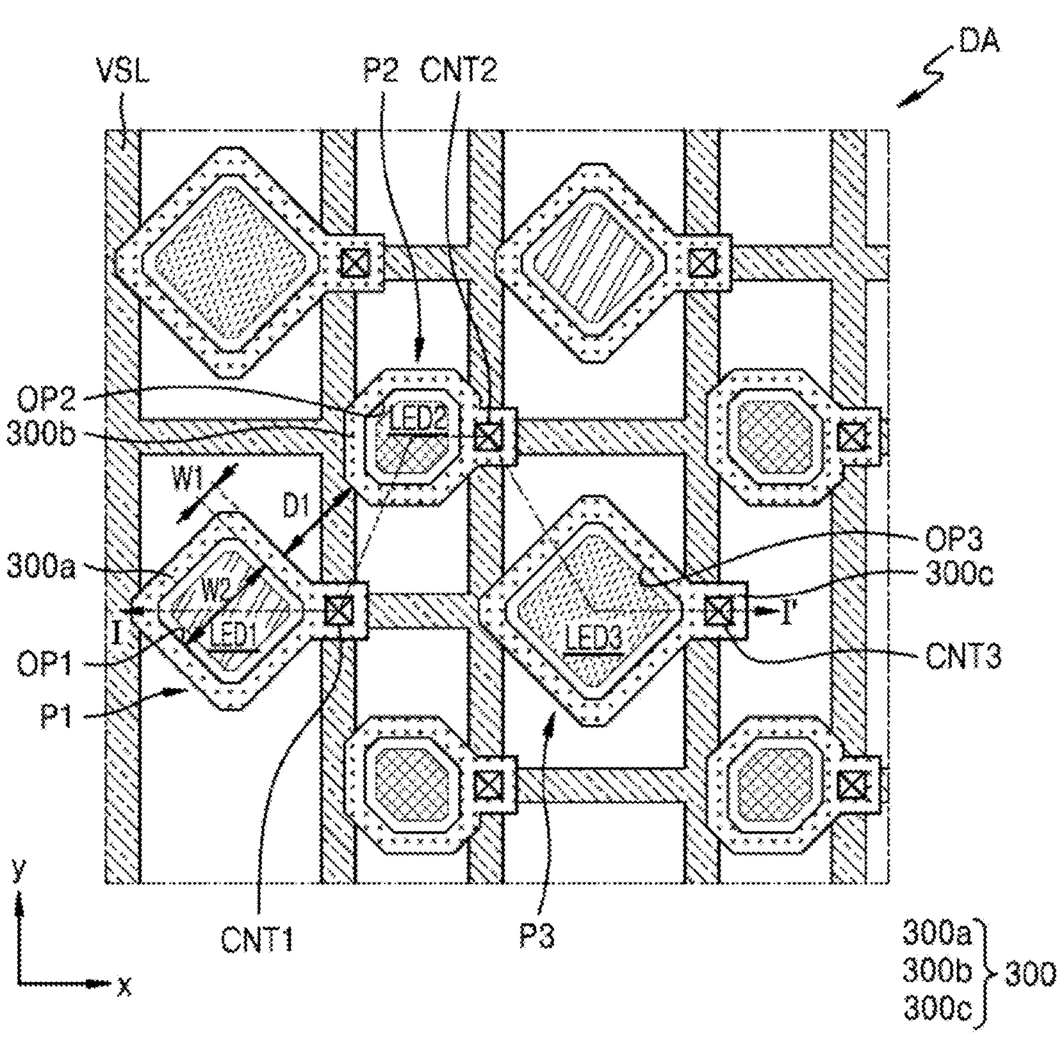
FIG. 4A is a schematic plan view of a display apparatus according to an embodiment.
Figure 4B:
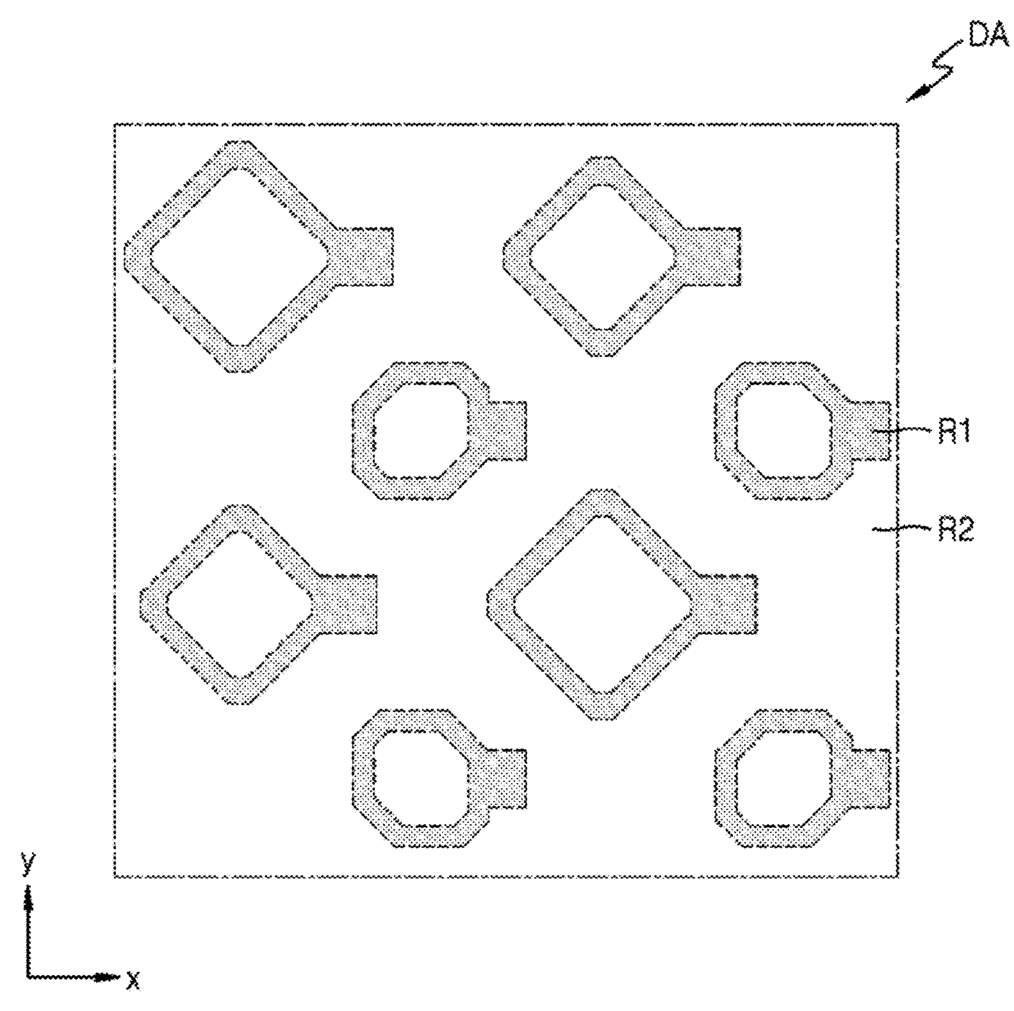
FIG. 4B is a schematic plan view of a first region and a second region of a display area according to an embodiment.

FIG. 4A is a schematic plan view of a display apparatus according to an embodiment. FIG. 4A is a schematic plan view of the display area DA of a display apparatus. FIG. 4B is a schematic plan view of a first region R1 and a second region R2 of the display area DA in an arca corresponding to FIG. 4A.

Referring to FIG. 4A, the display area DA of the display apparatus 1 may include a first sub-pixel P1, a second sub-pixel P2, and a third sub-pixel P3. In an embodiment, the first sub-pixel P1, the second sub-pixel P2, and the third sub-pixel P3 may emit light of different colors. For example, the first sub-pixel P1 may emit red light, the second sub-pixel P2 may emit green light, and the third sub-pixel P3 may emit blue light. The first sub-pixel P1 may include the first light-emitting diode LED1, the second sub-pixel P2 may include a second light-emitting diode LED2, and the third sub-pixel P3 may include a third light-emitting diode LED3.

The display apparatus 1 may include conductive bank layers 300 in the display arca DA. The conductive bank layers 300 may include a first conductive bank layer 300*a*, a second conductive bank layer 300*b*, and a third conductive bank layer 300*c*, which are spaced apart from each other. The first conductive bank layer 300*a*, the second conductive bank layer 300*b*, and the third conductive bank layer 300*c* may each have an island shape (or an isolated shape) in a plan view.

The conductive bank layers 300 may include openings respectively corresponding to the first to third sub-pixels P1, P2, and P3. For example, the first conductive bank layer 300*a* may include the first opening OP1 corresponding to the first sub-pixel P1, the second conductive bank layer 300*b* may include a second opening OP2 corresponding to the second sub-pixel P2, and the third conductive bank layer 300*c* may include a third opening OP3 corresponding to the third sub-pixel P3. The first to third openings OP1, OP2, and OP3 may be spaced apart from each other.

Each of the conductive bank layers 300 may overlap a single light-emitting diode. The first conductive bank layer

300*a* may overlap the first light-emitting diode LED1, the second conductive bank layer 300*b* may overlap the second light-emitting diode LED2, and the third conductive bank layer 300*c* may overlap the third light-emitting diode LED3.

The first to third light-emitting diodes LED1, LED2, and LED3 may respectively be disposed in the first opening OP1 of the first conductive bank layer 300*a*, the second opening OP2 of the second conductive bank layer 300*b*, and the third opening OP3 of the third conductive bank layer 300*c*.

The first to third light-emitting diodes LED1, LED2, and LED3 may respectively correspond to the first to third sub-pixels P1, P2, and P3. The first to third light-emitting diodes LED1, LED2, and LED3 may be arranged to have a diamond PenTile™ structure as shown in FIG. 4A, but embodiments are not limited thereto. The first to third light-emitting diodes LED1. LED2, and LED3 may be variously arranged to have a stripe or mosaic structure.

The conductive bank layers 300 may each be electrically connected to (e.g., directly contact) the auxiliary line VSL through a contact hole. The first conductive bank layer 300*a* may be electrically connected to (or directly contact) the auxiliary line VSL through a first contact hole CNT1. The second conductive bank layer 300*b* may be electrically connected to (or directly contact) the auxiliary line VSL through a second contact hole CNT2. The third conductive bank layer 300*c* may be electrically connected to (or directly contact) the auxiliary line VSL through a third contact hole CNT3. As described with reference to FIGS. 2A and 2B, the auxiliary line VSL may be a common voltage transfer line that transfers the common voltage ELVSS to the first to third light-emitting diodes LED1, LED2, and LED3.

In an embodiment, the auxiliary line VSL may have a mesh shape. For example, the auxiliary line VSL may have a structure in which portions extending in an x-axis direction and portions extending in a y-axis direction are connected to each other. In an embodiment, one of the first to third light-emitting diodes LED1, LED2, and LED3 may be disposed between the portions of the auxiliary line VSL, the portions extending in the x-axis direction. In an embodiment, one of the first to third light-emitting diodes LED1, LED2, and LED3 may be disposed in an area surrounded by portions of the auxiliary line VSL extending in the x-axis direction and portions of the auxiliary line VSL extending in the y-axis direction. In an embodiment, at least a portion of the auxiliary line VSL may be disposed between adjacent light-emitting diodes among the first to third light-emitting diodes LED1, LED2, and LED3. In an embodiment, at least a portion of the auxiliary line VSL may be disposed between adjacent sub-pixel electrodes among sub-pixel electrodes of the first to third light-emitting diodes LED1. LED2, and LED3, e.g., in a plan view.

In an embodiment, a width between an inner side surface and an outer side surface of each of the conductive bank layers 300 may be less than a width of an opening of each of the conductive bank layers 300. For example, a width W1 between an inner side surface and an outer side surface of the first conductive bank layer 300*a* may be less than a width W2 of the first opening OP1 of the first conductive bank layer 300*a*. However, embodiments are not limited thereto, and according to embodiments, a width of each of the conductive bank layers 300 may be greater than a width of the opening of each conductive bank layer 300.

In an embodiment, a distance between adjacent conductive bank layers 300 may be greater than the width between the inner side surface and the outer side surface of each conductive bank layer 300. For example, a distance D1 between the first conductive bank layer 300*a* and the second conductive bank layer 300*b*, which are adjacent to each other, may be greater than a width W1 between an inner side surface and an outer side surface of the first conductive bank layer 300*a*. However, embodiments are not limited thereto, and according to embodiments, a width between the inner side surface and the outer side surface of the conductive bank layer 300 may be greater than a distance between adjacent conductive bank layers.

Referring to FIGS. 4A and 4B, the display area DA may include a first region R1 where the conductive bank layers 300 are disposed, and a second region R2 where the conductive bank layers 300 are not disposed. The second region R2 may be disposed outside the first region R1 in which the conductive bank layers 300 are disposed.

In an embodiment, in the display area DA, an area (or size) of the first region R1 may be less than an area (or size) of the second region R2. An area in the display area DA, in which the conductive bank layers 300 are disposed, may be, for example, about 50% or less of a total area (or total size) of the display area DA. For example, an area (or size) of the first region R1 may be about 30% or more and about 50% or less of the total area (or total size) of the display area DA. For example, an area (or size) of a region where the conductive bank layers 300 are disposed may be about 35% or more and about 50% or less with respect to the total area (or total size) of the display area DA. For example, an area (or size) of the second region R2 may be about 50% or more and about 70% or less of the total area (or total size) of the display arca DA. For example, an area/size of a region where the conductive bank layers 300 are not disposed may be about 50% or more and about 70% or less of the total area (or total size) of the display area DA. As the second region R2 where the conductive bank layers 300 are not disposed is relatively large, gas from the organic insulating layer 110 (see FIG. 3A) may be readily discharged. Accordingly, a film lifting phenomenon of the display apparatus 1 may be reduced. Also, as the first region R1 where the conductive bank layers 300 are disposed is relatively reduced, infrared light transmittance of the display apparatus 1 may be increased.

Figure 5:
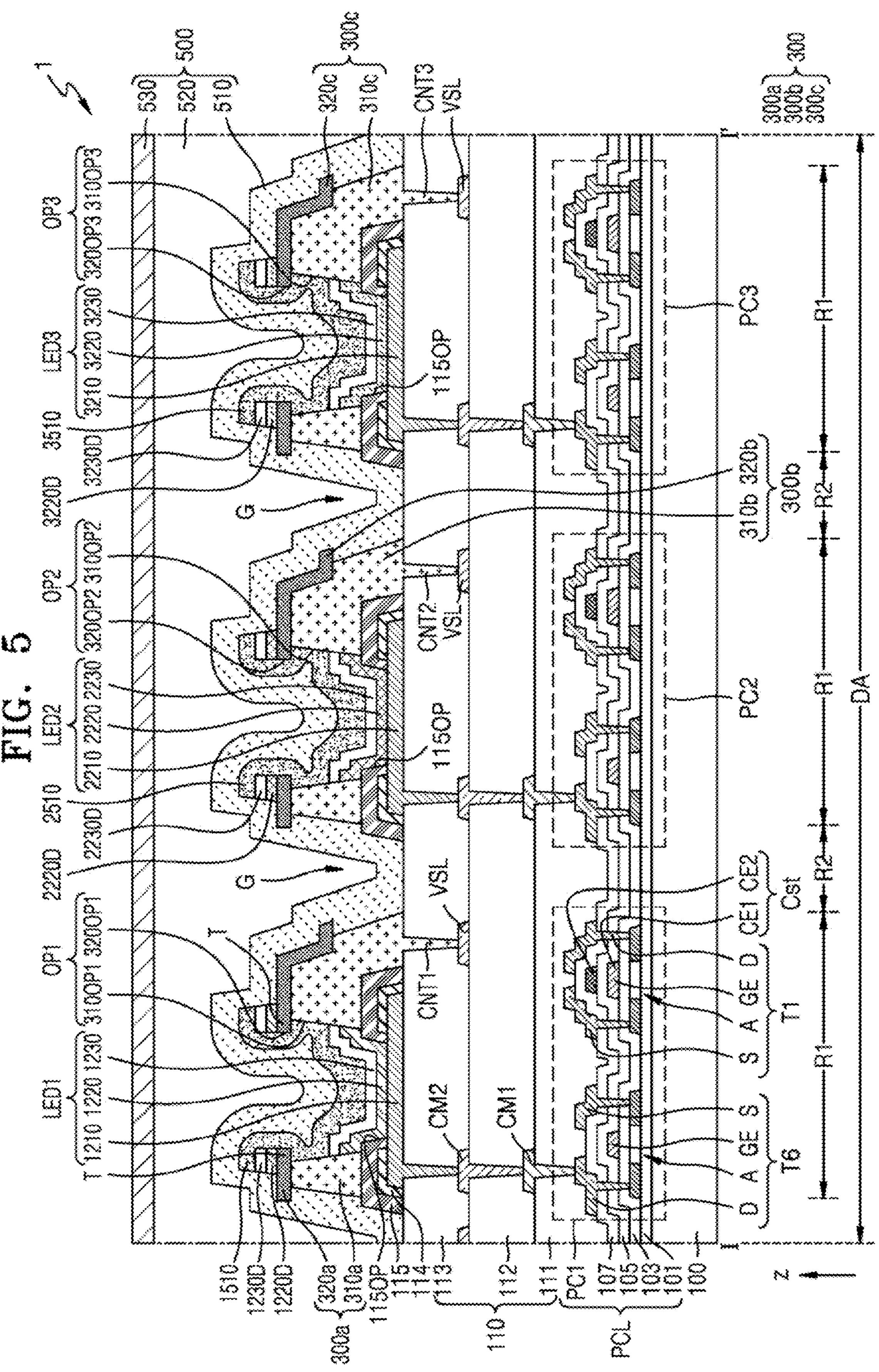
FIG. 5 is a schematic cross-sectional view of a display apparatus according to an embodiment.

FIG. 5 is a schematic cross-sectional view of a display apparatus according to an embodiment. FIG. 5A is a schematic cross-sectional view of the display apparatus taken along line I-I' of FIG. 4A.

Referring to FIG. 5, in the display area DA, the first light-emitting diode LED1, the second light-emitting diode LED2, and the third light-emitting diode LED3 may be disposed on the substrate 100. The first to third light-emitting diodes LED1, LED2, and LED3 may be respectively electrically connected to the first sub-pixel circuit PC1, the second sub-pixel circuit PC2, and the third sub-pixel circuit PC3. The first sub-pixel circuit PC1 is as described above with reference to FIG. 3A, and a second sub-pixel circuit PC2 and a third sub-pixel circuit PC3 may have substantially the same structure as the first sub-pixel circuit PC1.

A structure of the first light-emitting diode LED1, a structure in which the first conductive bank layer 300*a* has the tip portion T around the first opening OP1, structures of the protective layer 114, the insulating layer 115, and the first inorganic barrier layer 1510 on the first light-emitting diode LED1 are as described above with reference to FIG. 3A. The second light-emitting diode LED2 may include substantially the same structure as the first light-emitting diode LED1 described with reference to FIG. 3A, but may emit light of a different color from that of the first light-emitting diode LED1. The second light-emitting diode LED2 may include a second sub-pixel electrode 2210, a second intermediate layer 2220 on the second sub-pixel electrode 2210, and a second opposite electrode 2230 on the second intermediate layer 2220, and may emit light of a second color different from the first color. The second light-emitting diode LED2 may include substantially the same structure as the first light-emitting diode LED1 described with reference to FIG. 3A, but may emit light of a different color from that of the first light-emitting diode LED1 and the second light-emitting diode LED2. The third light-emitting diode LED3 may include a third sub-pixel electrode 3210, a third intermediate layer 3220 on the third sub-pixel electrode 3210, and a third opposite electrode 3230 on the third intermediate layer 3220, and may emit light of a third color different from the first color and the second color.

The first sub-pixel electrode 1210, the second sub-pixel electrode 2210, and the third sub-pixel electrode 3210 may respectively be electrically connected to the first sub-pixel circuit PC1, a second sub-pixel circuit PC2, and a third sub-pixel circuit PC3. Each of the first sub-pixel electrode 1210, the second sub-pixel electrode 2210, and the third sub-pixel electrode 3210 may include an inner side portion and an outer side portion surrounding the inner side portion. The first to third sub-pixel electrodes 1210, 2210, and 3210 may be disposed on the organic insulating layer 110 to be spaced apart from each other.

According to an embodiment described with reference to FIG. 5, it is illustrated that the first to third sub-pixel circuits PC1, PC2, and PC3 may respectively be electrically connected to the first to third sub-pixel electrodes 1210, 2210, and 3210 through the first connection conductive layer CM1 and the second connection conductive layer CM2, but embodiments are not limited thereto. In another example, the second connection conductive layer CM2 and the third organic insulating layer 113 may be omitted, and two organic insulating layers may be disposed between the first to third sub-pixel circuits PC1, PC2, and PC3 and the first to third sub-pixel electrodes 1210, 2210, and 3210.

Similarly to the structure of the first sub-pixel electrode 1210 described with reference to FIG. 3A, the second intermediate layer 2220 may overlap and contact the inner side portion of the second sub-pixel electrode 2210. An inner side portion of the second sub-pixel electrode 2210 may overlap the insulating layer 115. The third intermediate layer 3220 may overlap and contact an inner side portion of the third sub-pixel electrode 3210. An outer side portion of the third sub-pixel electrode 3210 may overlap the insulating layer 115. The insulating layer 115 may overlap an outer portion of each of the second sub-pixel electrode 2210 and the third sub-pixel electrode 3210, and may extend onto the third organic insulating layer 113 to cover a side surface of each of the second sub-pixel electrode 2210 and the third sub-pixel electrode 3210. The protective layer 114 may be disposed between the insulating layer 115 and an outer side portion of the second sub-pixel electrode 2210 and between the insulating layer 115 and an outer side portion of the third sub-pixel electrode 3210.

The second intermediate layer 2220 may be in contact with (e.g., in direct contact with) the second sub-pixel electrode 2210 through the opening 115OP of the insulating layer 115. For example, an inner side portion of the second intermediate layer 2220 may overlap and contact the second sub-pixel electrode 2210 through the opening 115OP of the insulating layer 115, and an outer portion thereof may extend onto the insulating layer 115 to overlap and contact the insulating layer 115. The second opposite electrode 2230 may overlap the second intermediate layer 2220. Similarly to the first intermediate layer 1220, the second intermediate layer 2220 may include a second emission layer, a first common layer, and a second common layer.

The third intermediate layer 3220 may be in contact with (e.g., in direct contact with) the third sub-pixel electrode 3210 through the opening 115OP of the insulating layer 115. For example, an inner side portion of the third intermediate layer 3220 may overlap and contact the third sub-pixel electrode 3210 through the opening 115OP of the insulating layer 115, and an outer side portion thereof may extend onto the insulating layer 115 to overlap and contact the insulating layer 115. Similarly to the first intermediate layer 1220, the third intermediate layer 3220 may include a second emission layer, a first common layer, and a second common layer. The third opposite electrode 3230 may overlap the third intermediate layer 3220. For example, the emission layer of the first intermediate layer 1220, the emission layer of the second intermediate layer 2220, and the emission layer of the third intermediate layer 3220 may emit light of different colors from each other.

The inner side portion of the second opposite electrode 2230 may overlap the second intermediate layer 2220 and the second sub-pixel electrode 2210, and the outer side portion thereof may extend onto the insulating layer 115 to overlap the insulating layer 115. The outer side portion of the second opposite electrode 2230 may contact (e.g., directly contact) a portion of a side surface of a second lower conductive layer 310*b* of the second conductive bank layer 300*b*. The inner side portion of the third opposite electrode 3230 may overlap the third intermediate layer 3220 and the third sub-pixel electrode 3210, and the outer side portion thereof may extend on to the insulating layer 115 to overlap the insulating layer 115. The outer side portion of the third opposite electrode 3230 may contact (e.g., directly contact) a portion of a side surface of a third lower conductive layer 310*c* of the third conductive bank layer 300*c*.

In the display area DA, the first region R1 may be a region where the conductive bank layers 300 overlap the organic insulating layer 110 or the substrate 100. The second region R2 may be a region where the conductive bank layers 300 do not overlap the organic insulating layer 110 or the substrate 100. The first region R1 may be a region where the first conductive bank layer 300*a*, the second conductive bank layer 300*b*, and the third conductive bank layer 300*c* are disposed, and the second region R2 may be a region outside the first region R1, and in which the first to third conductive bank layers 300*a*. 300*b*, and 300*c* are not disposed.

The first conductive bank layer 300*a*, the second conductive bank layer 300*b*, and the third conductive bank layer 300*c* may be disposed to be respectively overlap the first light-emitting diode LED1, the second light-emitting diode LED2, and the third light-emitting diode LED3. Each of the conductive bank layers 300 may overlap a single sub-pixel electrode. The conductive bank layers 300 may be disposed to respectively overlap the first to third sub-pixel electrodes 1210, 2210, and 3210. The conductive bank layers 300 may respectively be disposed on the first to third sub-pixel electrodes 1210, 2210, and 3210. The first conductive bank layer 300*a* may be disposed on the first sub-pixel electrode 1210. The second conductive bank layer 300*b* may be disposed on the second sub-pixel electrode 2210. The third conductive bank layer 300*c* may be disposed on the third sub-pixel electrode 3210.

The conductive bank layers 300 may have openings respectively overlapping the first to third sub-pixel electrodes 1210, 2210, and 3210. For example, the first conductive bank layer 300*a* may have the first opening OP1 overlapping the first sub-pixel electrode 1210, the second conductive bank layer 300*b* may have the second opening OP2 overlapping the second sub-pixel electrode 2210, and the third conductive bank layer 300*c* may have the third opening OP3 overlapping the third sub-pixel electrode 3210. The description of the first opening OP1 of the first conductive bank layer 300*a*, which has been made with reference to FIG. 3A, may be equally applied to the second opening OP2 of the second conductive bank layer 300*b* and the third opening OP3 of the third conductive bank layer 300*c*.

The second conductive bank layer 300*b* may include an overhang structure around the second opening OP2. For example, a second upper conductive layer 320*b* of the second conductive bank layer 300*b* may be formed to have an overhang structure by protruding more than the second lower conductive layer 310*b* toward the second opening OP2 of the second conductive bank layer 300*b*. For example, the second upper conductive layer 320*b* may have the tip portion T protruding in a direction (e.g., a direction facing the second opening OP2 or a lateral direction).

The third conductive bank layer 300*c* may include an overhang structure around the third opening OP3. For example, a third upper conductive layer 320*c* of the third conductive bank layer 300*c* may be formed to have an overhang structure by protruding more than the third lower conductive layer 310*c* toward the third opening OP3 of the third conductive bank layer 300*c*. For example, the third upper conductive layer 320*c* may include the tip portion T protruding in a direction (e.g., a direction facing the third opening OP3 or a lateral direction).

The second intermediate layer 2220 may be formed by a deposition operation/process, and in case that the second conductive bank layer 300*b* has an overhang structure, a material for forming the second intermediate layer 2220 may be deposited on the second sub-pixel electrode 2210, and may be deposited on an upper surface of the second conductive bank layer 300*b*, as shown in FIG. 5. The material deposited on the second sub-pixel electrode 2210 may correspond to the second intermediate layer 2220, and the material deposited on the upper surface of the second conductive bank layer 300*b* may correspond to a second-first dummy intermediate layer 2220D.

The third intermediate layer 3220 may be formed by a deposition operation/process, and in case that the third conductive bank layer 300*c* has an overhang structure, a material for forming the third intermediate layer 3220 may be deposited on the third sub-pixel electrode 3210, and may be deposited on an upper surface of the third conductive bank layer 300*c*, as shown in FIG. 5. The material deposited on the third sub-pixel electrode 3210 may correspond to the third intermediate layer 3220, and the material deposited on the upper surface of the third conductive bank layer 300*c* may correspond to a third-first intermediate layer 3220D.

Similarly to the second intermediate layer 2220, the second opposite electrode 2230 may be formed by a deposition process, and a second-first dummy opposite electrode 2230D may be disposed on the upper surface of the second conductive bank layer 300*b*. The second-first dummy opposite electrode 2230D may be disposed on the second-first dummy intermediate layer 2220D.

Similarly to the third intermediate layer 3220, the third opposite electrode 3230 may be formed by a deposition process, and a third-first dummy opposite electrode 3230D may be disposed on the upper surface of the third conductive bank layer 300*c*. The third-first dummy opposite electrode 3230D may be disposed on the third-first intermediate layer 3220D.

In an embodiment, the auxiliary line VSL may be disposed on the second organic insulating layer 112. In an embodiment, the auxiliary line VSL may be disposed between the second organic insulating layer 112 and the third organic insulating layer 113. In an embodiment, the auxiliary line VSL may be disposed between the first conductive bank layer 300*a* and the second organic insulating layer 112. In an embodiment, the auxiliary line VSL may be disposed between the second conductive bank layer 300*b* and the second organic insulating layer 112. In an embodiment, the auxiliary line VSL may be disposed between the third conductive bank layer 300*c* and the third organic insulating layer 113. In an embodiment, a layer, on which the auxiliary line VSL is disposed, may be disposed between a layer, on which the first to third sub-pixel electrodes 1210, 2210, and 3210 are disposed, and a layer, on which the first connection conductive layer CM1 is disposed. A position where the auxiliary line VSL is disposed may be changed according to embodiments. For example, the auxiliary line VSL may be disposed on the first organic insulating layer 111 to be disposed between the first organic insulating layer 111 and the second organic insulating layer 112.

In an embodiment, the auxiliary line VSL and the second connection conductive layer CM2 may be disposed on the same layer (e.g., the second organic insulating layer 112). In case that the auxiliary line VSL and the second connection conductive layer CM2 are formed on the same layer, a distance between the first to third light-emitting diodes LED1, LED2, and LED3 may be relatively reduced as compared with a case where the auxiliary line VSL and the first connection conductive layer CM1 are formed on the same layer. Accordingly, in case that each of the first to third light-emitting diodes LED1, LED2, and LED3 is connected to the auxiliary line VSL disposed below the display area DA through the conductive bank layer 300, decrease (or reduction) in resolution may be prevented, and the display quality of the display apparatus 1 may be improved.

The auxiliary line VSL may be electrically connected (or in direct contact) to the conductive bank layer 300 through a contact hole. The auxiliary line VSL may be electrically connected (or in direct contact) to the first conductive bank layer 300*a* through the first contact hole CNT1, may be electrically connected (or in direct contact) to the second conductive bank layer 300*b* through the second contact hole CNT2, and may be electrically connected (or in direct contact) to the third conductive bank layer 300*c* through the third contact hole CNT3. In an embodiment, each of the first contact hole CNT1, the second contact hole CNT2, and the third contact hole CNT3 may expose an upper surface of the auxiliary line VSL by penetrating (or passing through) the third organic insulating layer 113.

The auxiliary line VSL may be electrically connected to each of the first opposite electrode 1230, the second opposite electrode 2230, and the third opposite electrode 3230. The auxiliary line VSL may be electrically connected to the first opposite electrode 1230 through the first contact hole CNT1 and the first conductive bank layer 300*a*, and may be electrically connected to the second opposite electrode 2230 through the second contact hole CNT2 and the second conductive bank layer 300*b*, and may be electrically connected to the third opposite electrode 3230 through the third contact hole CNT3 and the third conductive bank layer 300*c*. As described with reference to FIGS. 2A and 2B, the auxiliary line VSL may be a transfer line that transfers a common voltage ELVSS to the first to third light-emitting diodes LED1, LED2, and LED3.

The auxiliary line VSL and the second connection conductive layer CM2 may include the same material. The auxiliary line VSL may include Al, Cu, and/or Ti, and may include a single layer or a multilayer that includes the above material.

A second inorganic barrier layer 2510 may overlap and cover the second light-emitting diode LED2. A third inorganic barrier layer 3510 may overlap and cover the third light-emitting diode LED3. The second and third inorganic barrier layers 2510 and 3510 may each include one or more inorganic insulating materials from among aluminum oxide, titanium oxide, tantalum oxide, hafnium oxide, zinc oxide, silicon oxide, silicon nitride, and silicon oxynitride, and may be deposited in the same way as chemical vapor deposition. The first inorganic barrier layer 1510, the second inorganic barrier layer 2510, and the third inorganic barrier layer 3510 may be separated and spaced apart from each other.

The second inorganic barrier layer 2510 may not be separated or disconnected by the overhang structure of the second conductive bank layer 300*b* by having relatively better step coverage than the second intermediate layer 2220 and the second opposite electrode 2230. The second inorganic barrier layer 2510 may continuously overlap and cover an upper surface, a side surface, and a bottom surface of the tip portion T around the second opening OP2, a side surface of the second lower conductive layer 310*b*, the side surface facing the second opening OP2, and the second light-emitting diode LED2.

The third inorganic barrier layer 3510 may not be separated or disconnected by the overhang structure of the third conductive bank layer 300*c* by having relatively better step coverage than the third intermediate layer 3220 and the third opposite electrode 3230. The third inorganic barrier layer 3510 may continuously overlap and cover upper, side, and bottom surfaces of the tip portion T around the third opening OP3, a side surface of the third lower conductive layer 310*c*, the surface facing the third opening OP3, and the third light-emitting diode LED3.

To prevent impurities from proceeding (or permeating) toward the first to third light-emitting diodes LED1, LED2, and LED3, a groove G may be disposed between adjacent light-emitting diodes. In an embodiment, the groove G may be disposed between adjacent conductive bank layers 300. For example, the groove G may be disposed in the second region R2 where the conductive bank layers 300 are not disposed. The groove G may have a concave shape with respect to upper surfaces of the conductive bank layers 300. In the description, as the conductive bank layers 300 are spaced apart from each other, and the groove G is formed between adjacent light-emitting diodes, the reliability of the display apparatus 1 may be improved by preventing impurities from moving to the first to third light-emitting diodes LED1, LED2, and LED3.

FIG. 6 is a schematic cross-sectional view of the display apparatus 1 according to an embodiment. FIG. 6 is an embodiment in which the arrangements of the organic insulating layer 110 and the auxiliary line VSL are changed from the embodiment of FIG. 5, and the changed part is described below. In FIG. 6, descriptions already given with reference to the embodiment described with reference to FIG. 5 are omitted or simplified.

Referring to FIG. 6, the auxiliary line VSL and a connection conductive layer CM connected to a transistor of a pixel circuit may be disposed on the same layer. In an embodiment, the auxiliary line VSL may be disposed on the first organic insulating layer 111. In an embodiment, a layer, on which the auxiliary line VSL is disposed, may be disposed between a layer, on which the first to third sub-pixel electrodes 1210, 2210, and 3210 are disposed, and a layer, on which a source electrode S and a drain electrode D of a transistor of the first to third sub-pixel circuits PC1, PC2, and PC3 are disposed.

The organic insulating layer 110 may be disposed on the pixel circuit layer PCL. The organic insulating layer 110 may include the first organic insulating layer 111 on the pixel circuit layer PCL and the second organic insulating layer 112 on the first organic insulating layer 111.

The first organic insulating layer 111 may be disposed between the first sub-pixel circuit PC1 and the connection conductive layer CM, between the second sub-pixel circuit PC2 and the connection conductive layer CM, and the third sub-pixel circuit PC3 and the connection conductive layer CM. The first organic insulating layer 111 may include an organic insulating material, such as acrylic, BCB, polyimide, or HMDSO.

The connection conductive layer CM may be disposed between the first organic insulating layer 111 and the second organic insulating layer 112. The connection conductive layer CM may be disposed on the pixel circuit layer PCL, and may be electrically connected to a transistor of the pixel circuit layer PCL. The connection conductive layer CM may be connected to (e.g., in direct contact with) the transistor of the pixel circuit layer PCL through a contact hole of the first organic insulating layer 111. For example, the connection conductive layer CM may be connected to (e.g., in direct contact with) the sixth transistor T6 of the first sub-pixel circuit PC1, the connection conductive layer CM may include Al, Cu, and/or Ti, and may include a single layer or a multilayer that includes the above material.

The second organic insulating layer 112 may be disposed on the first organic insulating layer 111. The second organic insulating layer 112 may be disposed between the connection conductive layer CM and the first to third sub-pixel electrodes 1210, 2210, and 3210. The second organic insulating layer 112 may include an organic insulating material, such as acrylic, BCB, polyimide, or HMDSO.

The first to third sub-pixel electrodes 1210, 2210, and 3210 may be disposed on the second organic insulating layer 112.

The auxiliary line VSL may be electrically connected to (e.g., in direct contact with) the first conductive bank layer 300*a* through the first contact hole CNT1. The auxiliary line VSL may be electrically connected to (e.g., in direct contact with) the second conductive bank layer 300*b* through the second contact hole CNT2. The auxiliary line VSL may be electrically connected to (e.g., in direct contact with) the third conductive bank layer 300*c* through the third contact hole CNT3. In an embodiment, each of the first contact hole CNT1, the second contact hole CNT2, and the third contact hole CNT3 may expose the upper surface of the auxiliary line VSL by penetrating (or passing through) the second organic insulating layer 112.

Figure 7:
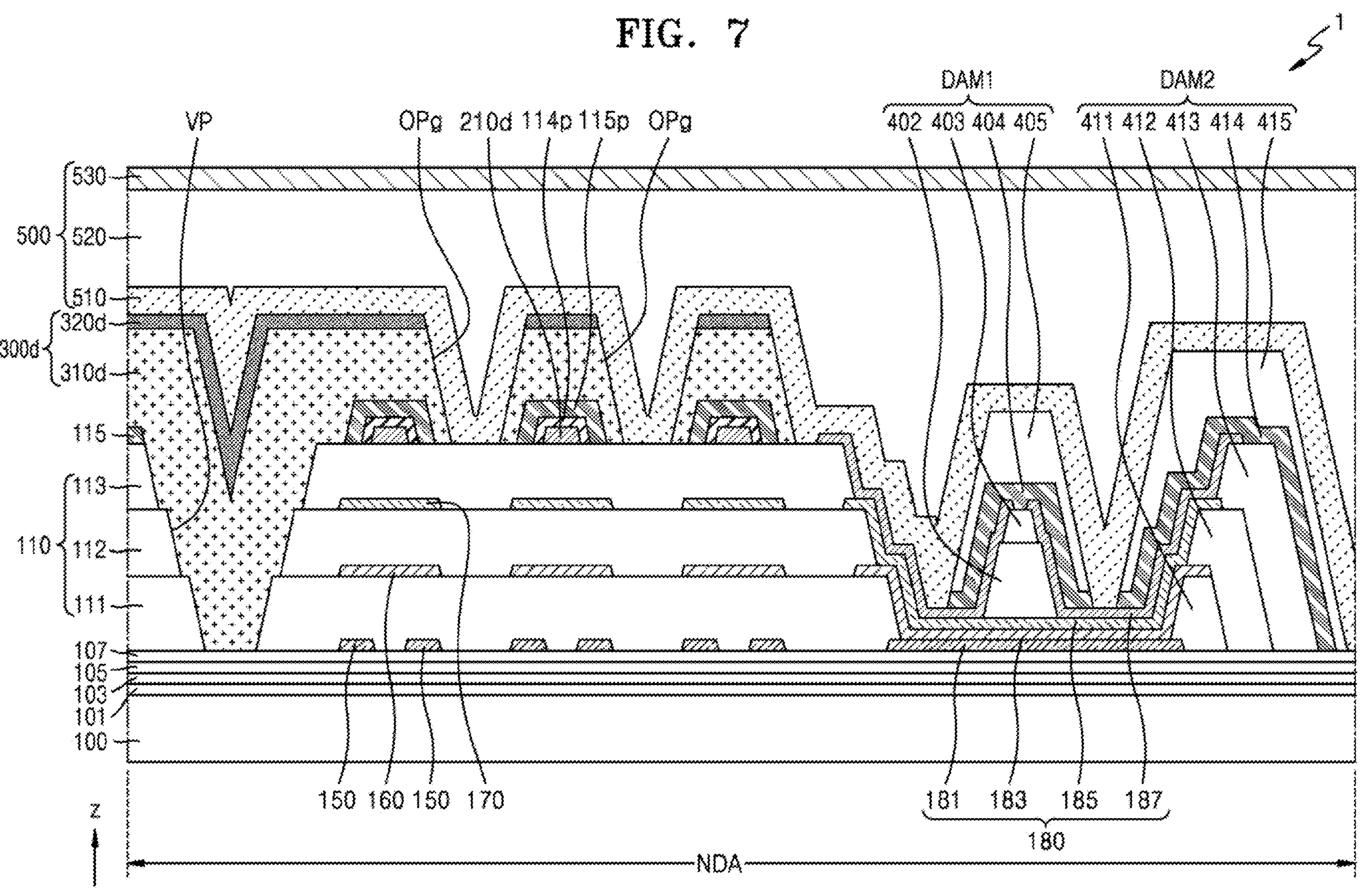
FIG. 7 is a schematic cross-sectional view of a non-display area of a display apparatus according to an embodiment.

FIG. 7 is a schematic cross-sectional view of the non-display area NDA of the display apparatus 1 according to an embodiment.

Referring to FIG. 7, the buffer layer 101, the first gate insulating layer 103, the first interlayer insulating layer 105, the second interlayer insulating layer 107, and the organic insulating layer 110 may extend from the display area DA (refer to FIG. 5) to the non-display arca NDA. In the non-display area NDA, a fourth conductive bank layer 300*d* may be disposed on the organic insulating layer 110. The insulating layer 115 may be disposed on the organic insulating layer 110.

In an embodiment, the organic insulating layer 110 may include the first organic insulating layer 111, the second organic insulating layer 112, and the third organic insulating layer 113, but embodiments are not limited thereto. For example, as described above with reference to FIG. 6, the organic insulating layer 110 may include two layers including the first organic insulating layer 111 and the second organic insulating layer 112.

In the non-display area NDA, the organic insulating layer 110 may include a valley portion VP. The valley portion VP of the organic insulating layer 110 may be an opening portion formed by removing a portion of the organic insulating layer 110. The valley portion VP may be an opening portion exposing the second interlayer insulating layer 107. The valley portion VP may be an opening portion for preventing impurities such as oxygen or moisture from the outside from penetrating into the display area DA through the organic insulating layer 110. The fourth conductive bank layer 300*d* may be disposed on the valley portion VP of the organic insulating layer 110. In an embodiment, the fourth conductive bank layer 300*d* may cover (e.g., completely cover) the valley portion VP. Accordingly, impurities penetrating into the organic insulating layer 110 of the non-display area NDA may be effectively prevented from penetrating into the organic insulating layer 110 in the display area DA. First signal lines 150 may be disposed between the second interlayer insulating layer 107 and the first organic insulating layer 111. Second signal lines 160 may be disposed between the first organic insulating layer 111 and the second organic insulating layer 112. In an embodiment, third signal lines 170 may be disposed between the second organic insulating layer 112 and the third organic insulating layer 113. In another example, the arrangements of the first to third signal lines 150, 160, and 170 may be variously changed. In another example, the second signal line 160 or the third signal line 170 may be omitted. The first to third signal lines 150, 160, and 170 may each include a conductive material including Mo, Al, Cu. Ti, or the like, and may include a single layer or a multilayer that includes the above material.

The fourth conductive bank layer 300*d* may be spaced apart from the first to third conductive bank layers 300*a*, 300*b*, and 300*c* described with reference to FIGS. 4A to 5. The fourth conductive bank layer 300*d* may be electrically connected to the first to third conductive bank layers 300*a*, 300*b*, and 300*c*. The fourth conductive bank layer 300*d* and the first to third conductive bank layers 300*a*, 300*b*, and 300*c* may include the same material.

The fourth conductive bank layer 300*d* may include a fourth lower conductive layer 310*d* and a fourth upper conductive layer 320*d* on the fourth lower conductive layer 310*d*. The fourth lower conductive layer 310*d* and the fourth upper conductive layer 320*d* may include metals having different etch selectivities. The fourth lower conductive layer 310*d* and the first to third lower conductive layers 310*a*, 310*b*, and 310*c* may include the same material. The fourth upper conductive layer 320*d* and the first to third upper conductive layers 320*a*, 320*b*, and 320*c* may include the same material.

A common power supply line 180 may be in the non-display area NDA. The common power supply line 180 may be disposed adjacent to an edge portion of the display apparatus 1. The common power supply line 180 may be disposed parallel to the edge portion of the substrate 100 to surround at least a portion of the display area DA described with reference to FIGS. 1A and 1B. In an embodiment, the common power supply line 180 may include a first line 181, a second line 183 disposed on the first line 181, a third line 185 disposed on the second line 183, and a fourth line 187 disposed on the third line 185. In another example, the common power supply line 180 may omit the third line 185 and include the first line 181, the second line 183, and the fourth line 187 on the second line 183.

The first line 181 may be disposed on the second interlayer insulating layer 107, and an inner side edge portion thereof may be covered by the first organic insulating layer 111. The second line 183 may be disposed between the first organic insulating layer 111 and the second organic insulating layer 112, and may be connected to the first line 181 at the outside of the first organic insulating layer 111. The third line 185 may be disposed between the second organic insulating layer 112 and the third organic insulating layer 113, and may be connected to the second line 183 at the outside of the second organic insulating layer 112. The first line 181, the second line 183, and the third line 185 may each include a conductive material including Mo, Al, Cu, Ti, or the like, and may include a single-layered structure or a multilayered structure, each including the above material. In an embodiment, the first line 181 and the source source electrode S (refer to FIG. 5) and/or the drain electrode D (refer to FIG. 5) may include the same material. The second line 183 and the first connection conductive layer CM1 (refer to FIG. 5) may include the same material. The third line 185 and the second connection conductive layer CM2 (refer to FIG. 5) may include the same material.

The fourth line 187 may be disposed on the third organic insulating layer 113, and may be connected to the third line 185 at the outside of the third organic insulating layer 113. The fourth line 187 and the first to third sub-pixel electrodes 1210, 2210, and 3210 as described with reference to FIG. 5 may include the same material. In an embodiment, the fourth line 187 may have a structure in which an ITO layer, an Ag layer, and an ITO layer are sequentially stacked.

The auxiliary line VSL described with reference to FIGS. 4A to 5 may be electrically connected to the common power supply line 180. Accordingly, the first to third conductive bank layers 300*a*, 300*b*, and 300*c* described with reference to FIGS. 4A to 5 may receive the common voltage ELVSS from the common power supply line 180.

A first dam DAM1 and a second dam DAM2 may be spaced apart from each other in the non-display area NDA. In an embodiment, it is illustrated that the first dam DAM1 includes a first-first organic layer 402, a first-second organic layer 403, a first inorganic layer 404, and a first-third organic layer 405, and the second dam DAM2 includes a second-first organic layer 411, a second-second organic layer 412, a second-third organic layer 413, a second inorganic layer 414, and a second-fourth organic layer 415, but embodiments are not limited thereto. For example, the first dam DAM1 and/or the second dam DAM2 may further include one or more organic layers, one or more inorganic layers, and/or one or more metal layers. In another example, some of the layers configuring the first dam DAM1 and/or the second dam DAM2 may also be omitted. A height of each organic layer and an inorganic layer may be variously changed according to embodiments.

The first dam DAM1 may be disposed to overlap the common power supply line 180.

For example, the first-first organic layer 402 of the first dam DAM1 may be disposed on the common power supply line 180. For example, the first-first organic layer 402 of the first dam DAM1 may be disposed on the third line 185 of the common power supply line 180. The first-second organic layer 403 of the first dam DAM1 may be disposed to overlap the first-first organic layer 402 in a plan view. The first-second organic layer 403 of the first dam DAM1 may be disposed on the first-first organic layer 402 and overlap the first-first organic layer 402. The fourth line 187 of the common power supply line 180 may be disposed to cover at least a portion of the first-first organic layer 402 and the first-second organic layer 403.

The first-first organic layer 402 and the first-second organic layer 403 may each include an organic insulating material. The organic insulating material may include acrylic, BCB, PI, HMDSO, or the like. In an embodiment, the first-first organic layer 402 and the second organic insulating layer 112 may include the same material. In an embodiment, the first-second organic layer 403 and the third organic insulating layer 113 may include the same material.

The first inorganic layer 404 may be disposed to overlap the first-first organic layer 402 and the first-second organic layer 403 in a plan view. The first inorganic layer 404 may be disposed on the common power supply line 180. In an embodiment, the fourth line 187 may be disposed on the first inorganic layer 404 of the common power supply line 180. The first inorganic layer 404 may include an inorganic insulating material, such as silicon oxide, silicon nitride, and silicon oxynitride, and may include a single layer or a multilayer that includes the above inorganic insulating material. In an embodiment, the first inorganic layer 404 and the insulating layer 115 (refer to FIG. 5) may include the same material.

The first-third organic layer 405 may be disposed on the first inorganic layer 404. The first-third organic layer 405 may include an organic insulating material. The organic insulating material may include acrylic, BCB, PI, HMDSO, or the like.

The second dam DAM2 may be disposed to cover an outer side edge portion of the common power supply line 180. For example, the second-first organic layer 411 of the second dam DAM2 may cover an outer side edge portion of the first line 181 of the common power supply line 180, the second-second organic layer 412 may cover an outer side edge portion of the second line 183 of the common power supply line 180, and the second-third organic layer 413 may cover an outer side edge portion of the third line 185 of the common power supply line 180. An outer side edge portion of the fourth line 187 of the common power supply line 180 may be disposed between the second-third organic layer 413 and the second inorganic layer 414.

The second-second organic layer 412 may be disposed on the second-first organic layer 411 to cover the second-first organic layer 411. The outer side edge portion of the second line 183 of the common power supply line 180 may be disposed on the second-first organic layer 411, and the second-second organic layer 412 may cover the outer side edge portion of the second line 183.

The second-third organic layer 413 may be disposed on the second-second organic layer 412 to cover the second-second organic layer 412. The outer side edge portion of the third line 185 of the common power supply line 180 may be disposed on the second-second organic layer 412, and the second-third organic layer 413 may cover the outer side edge portion of the third line 185.

The second-first organic layer 411, the second-second organic layer 412, and the second-third organic layer 413 may each include an organic insulating material. The organic insulating material may include acrylic, BCB, PI, HMDSO, or the like. In an embodiment, the second-first organic layer 411 and the first organic insulating layer 111 may include the same material. In an embodiment, the second-second organic layer 412 and the second organic insulating layer 112 may include the same material. The first-first organic layer 402 and the second-second organic layer 412 may be simultaneously formed in an operation/process of forming the second organic insulating layer 112. The second-third organic layer 413 and the third organic insulating layer 113 may include the same material. The first-second organic layer 403 and the second-third organic layer 413 may be simultaneously formed in an operation/process of forming the third organic insulating layer 113.

The second inorganic layer 414 may be disposed on the second-third organic layer 413 to cover the second-third organic layer 413. The second inorganic layer 414 may be disposed to cover the outer side edge portion of the fourth line 187 of the common power supply line 180, which is positioned on the second-third organic layer 413. The second inorganic layer 414 may include an inorganic insulating material, such as silicon oxide, silicon nitride, and silicon oxynitride, and may include a single-layered structure or a multi-layered structure that includes the above inorganic insulating material. In an embodiment, the second inorganic layer 414 and the insulating layer 115 may include the same material. The first inorganic layer 404 and the second inorganic layer 414 may be simultaneously formed in an operation/process of forming the insulating layer 115.

The second-fourth organic layer 415 may be disposed on the second inorganic layer 414. The second-fourth organic layer 415 may include an organic insulating material. The organic insulating material may include acrylic, BCB, PI, HMDSO, or the like.

In an embodiment, the fourth conductive bank layer **300*d* may include an exhaust opening OPg positioned between the valley portion VP and the first dam DAM1, e.g., in a plan view. The exhaust opening OPg may be disposed between the valley portion VP and the common power supply line 180. The exhaust opening OPg may expose an upper surface of the organic insulating layer 110 to provide a passage through which gas emitted by the organic insulating layer 110** is discharged.

Unlike the case where each of the first to third conductive bank layers **300*a*, 300*b*, and 300*c* receives a common voltage through an auxiliary line and a contact hole, the fourth conductive bank layer 300*d* may not receive a common voltage from the common power supply line 180. For example, in an embodiment, the fourth conductive bank layer 300*d* may be electrically insulated from the common power supply line 180**.

In an embodiment, the fourth conductive bank layer **300*d* between the valley portion VP and the first dam DAM1 may be spaced apart from the first organic insulating layer 111 or the second organic insulating layer 112. For example, the fourth conductive bank layer 300*d* between the valley portion VP and the first dam DAM1 may be insulated from the third signal line 170. In an embodiment in which the third signal line 170 between the valley portion VP and the first dam DAM1 is omitted, the fourth conductive bank layer 300*d* may be insulated from the second signal line 160. In an embodiment, the fourth conductive bank layer 300*d* between the valley portion VP and the common power supply line 180 may be spaced apart from the first organic insulating layer 111 or the second organic insulating layer 112**.

In the non-display area NDA of an embodiment, a conductive pattern layer 210 on the organic insulating layer 110, a protective pattern layer 114*p* on the conductive pattern layer 210*d*, and an insulating pattern layer 115*p* on the protective pattern layer 114*p* may be included. The conductive pattern layer 210, the protective pattern layer 114*p*, and the insulating pattern layer 115*p* may be disposed between the valley portion VP and the first dam DAM1. The conductive pattern layer 210 and the first to third sub-pixel electrodes 1210, 2210, and 3210 as described with reference to FIG. 5 may include the same material. The protective pattern layer 114*p* and the protective layer 114 may include the same material. The insulating pattern layer 115*p* and the insulating layer 115 may include the same material.

Figure 8:
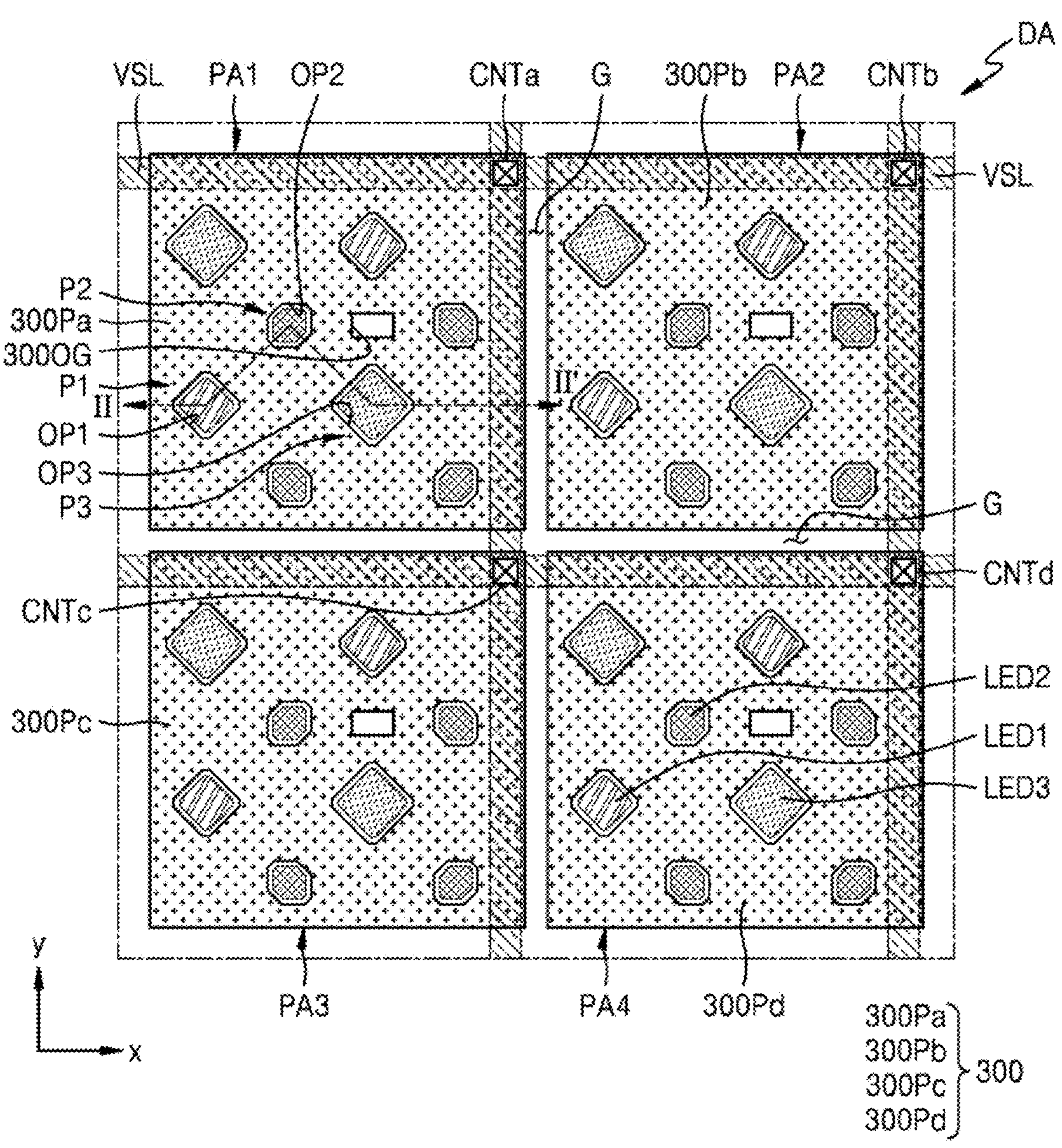
FIG. 8 is a schematic plan view of a display apparatus according to an embodiment.
Figure 9:
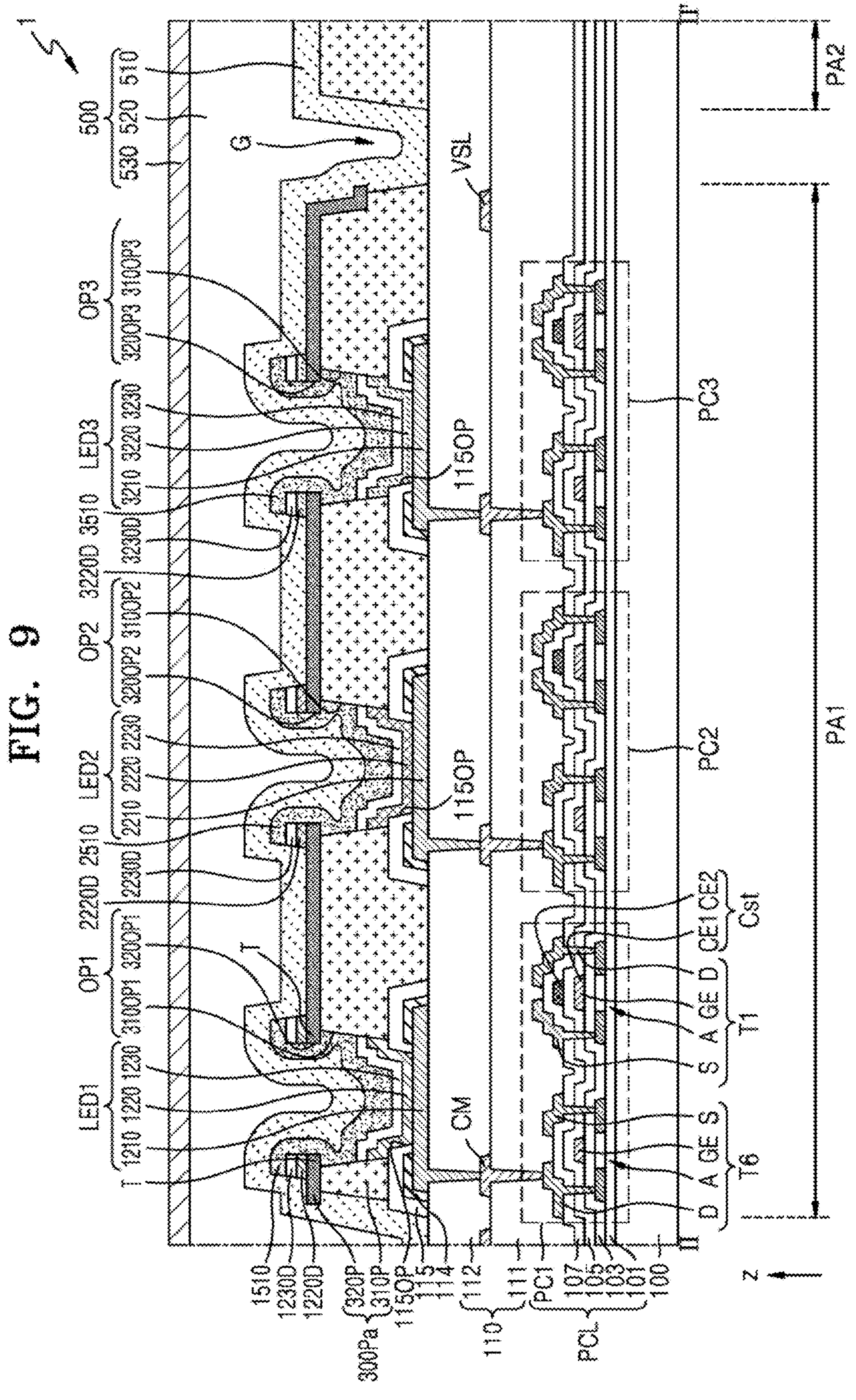
FIG. 9 is a schematic cross-sectional view of a display apparatus according to an embodiment.

FIG. 8 is a schematic plan view of the display arca DA of a display apparatus according to an embodiment. FIG. 9 is a schematic cross-sectional view of a display apparatus according to an embodiment. FIG. 9 is a schematic cross-sectional view taken along line II-II' of FIG. 8. In FIGS. 8 and 9, descriptions already given with reference to FIGS. 3A to 6 are omitted or simplified.

Referring to FIGS. 8 and 9, the display arca DA of the display apparatus 1 may include the first sub-pixel P1, the second sub-pixel P2, and the third sub-pixel P3. The display apparatus 1 may include a first unit pixel area PA1, a second unit pixel area PA2, a third unit pixel arca PA3, and a fourth unit pixel area PA4. Each of the first to fourth unit pixel areas PA1, PA2, PA3, and PA4 may include at least one first sub-pixel P1, at least one second sub-pixel P2, and at least one third sub-pixel P3. FIG. 8 illustrates that each of the first to fourth unit pixel areas PA1. PA2, PA3, and PA4 is an area including two first sub-pixels P1, two second sub-pixels P2, and four third sub-pixels P3, but embodiments are not limited thereto.

The first unit pixel area PA1 and the second unit pixel area PA2 may be disposed adjacent to each other in a first direction (e.g., an x-axis direction). The third unit pixel arca PA3 and the fourth unit pixel area PA4 may be disposed adjacent to each other in the first direction (e.g., the x-axis direction). The first unit pixel area PA1 and the third unit pixel arca PA3 may be disposed adjacent to each other in a second direction (e.g., a y-axis direction) crossing the first direction. The second unit pixel area PA2 and the fourth unit pixel area PA4 may be disposed adjacent to each other in the second direction (e.g., y-axis direction).

In an embodiment, the first sub-pixel P1, the second sub-pixel P2, and the third sub-pixel P3 may emit light of different colors. For example, the first sub-pixel PI may emit red light, the second sub-pixel P2 may emit green light, and the third sub-pixel P3 may emit blue light. The first sub-pixel PI may include the first light-emitting diode LED1, the second sub-pixel P2 may include the second light-emitting diode LED2, and the third sub-pixel P3 may include the third light-emitting diode LED3.

The display apparatus 1 may include conductive bank layers 300 in the display arca DA. The conductive bank layers 300 may be spaced apart from each other by a groove G disposed between adjacent conductive bank layers 300. The groove G may have a concave shape with respect to an upper surface of the conductive bank layer 300, as shown in FIG. 9. The conductive bank layer 300 may include a lower conductive layer and an upper conductive layer on the lower conductive layer. For example, as shown in FIG. 9, a first conductive bank layer 300Pa may include a lower conductive layer 310P and an upper conductive layer 320P.

The conductive bank layers 300 may include the first conductive bank layer 300Pa, a second conductive bank layer 300Pb, a third conductive bank layer 300Pc, and a fourth conductive bank layer 300Pd. The first to fourth conductive bank layers 300Pa, 300Pb, 300Pc, and 300Pd may be spaced apart from each other. In an embodiment, the first conductive bank layer 300Pa and the second conductive bank layer 300Pb may be spaced apart from each other by the groove G. In an embodiment, the first conductive bank layer 300Pa and the third conductive bank layer 300Pc may be spaced apart from each other by the groove G. In an embodiment, the second conductive bank layer 300Pb and the fourth conductive bank layer 300Pd may be spaced apart from each other by the groove G.

The first conductive bank layer 300Pa may be disposed in the first unit pixel area PA1. For example, the first conductive bank layer 300Pa may be disposed to overlap at least one first sub-pixel P1, at least one second sub-pixel P2, and at least one third sub-pixel P3. The second conductive bank layer 300Pb may be disposed in the second unit pixel area PA2. For example, the second conductive bank layer 300Pb may be disposed to overlap at least one first sub-pixel P1, at least one second sub-pixel P2, and at least one third sub-pixel P3. The third conductive bank layer 300Pc may be arranged in the third unit pixel area PA3. The fourth conductive bank layer 300Pd may be disposed in the fourth unit pixel area PA4.

The conductive bank layers 300 may each be disposed to overlap light-emitting diodes. For example, the first conductive bank layer 300Pa may be disposed to overlap the first to third light-emitting diodes LED1, LED2, and LED3. The conductive bank layers 300 may each be disposed to overlap sub-pixel electrodes. For example, the first conductive bank layer 300Pa may be disposed to overlap the first to third sub-pixel electrodes 1210, 2210, 3210 of the first to third light-emitting diodes LED1, LED2, and LED3.

Each of the first to fourth conductive bank layers 300Pa, 300Pb, 300Pc, and 300Pd may include the first opening OP1 corresponding to (or overlapping) the first sub-pixel P1, the second opening OP2 corresponding to (or overlapping) the second sub-pixel P2, and the third opening OP3 corresponding to (or overlapping) the third sub-pixel P3. The first to third openings OP1, OP2, and OP3 may be spaced apart from each other.

The first to third light-emitting diodes LED1, LED2, and LED3 may be respectively disposed in the first opening OP1, the second opening OP2, and the third opening OP3 of the first conductive bank layer 300Pa. The first to third light-emitting diodes LED1, LED2, and LED3 may be respectively disposed in the first opening OP1, the second opening OP2, and the third opening OP3 of the second conductive bank layer 300Pb. The first to third light-emitting diodes LED1, LED2, and LED3 may be respectively disposed in the first opening OP1, the second opening OP2, and the third opening OP3 of the third conductive bank layer 300Pc. The first to third light-emitting diodes LED1, LED2, and LED3 may be respectively disposed in the first opening OP1, the second opening OP2, and the third opening OP3 of the fourth conductive bank layer 300Pd.

The first opening OP1, the second opening OP2, and the third opening OP3 of the first conductive bank layer 300Pa may respectively overlap the sub-pixel electrode of the first light-emitting diode LED1, the sub-pixel electrode of the second light-emitting diode LED2, and the sub-pixel electrode of the third light-emitting diode LED3. For example as shown in FIG. 9, the first opening OP1 of the first conductive bank layer 300Pa may overlap the first sub-pixel electrode 1210 of the first light-emitting diode LED1, the second opening OP2 of the first conductive bank layer 300Pa may overlap the second sub-pixel electrode 2210 of the second light-emitting diode LED2, and the third opening OP3 of the first conductive bank layer 300Pa may overlap the third sub-pixel electrode 3210 of the third light-emitting diode LED3. The first opening OP1, the second opening OP2, and the third opening OP3 of the second conductive bank layer 300Pb may respectively overlap the sub-pixel electrode of the first light-emitting diode LED1, the sub-pixel electrode of the second light-emitting diode LED2, and the sub-pixel electrode of the third light-emitting diode LED3. The first opening OP1, the second opening OP2, and the third opening OP3 of the third conductive bank layer 300Pc may respectively overlap the sub-pixel electrode of the first light-emitting diode LED1, the sub-pixel electrode of the second light-emitting diode LED2, and the sub-pixel electrode of the third light-emitting diode LED3. The first opening OP1, the second opening OP2, and the third opening OP3 of the fourth conductive bank layer 300Pd may respectively overlap the sub-pixel electrode of the first light-emitting diode LED1, the sub-pixel electrode of the second light-emitting diode LED2, and the sub-pixel electrode of the third light-emitting diode LED3.

The first to fourth conductive bank layers 300Pa, 300Pb, 300Pc, and 300Pd may each be electrically connected to (e.g., in direct contact with) the auxiliary line VSL through a contact hole. The first conductive bank layer 300Pa may be electrically connected to (e.g., in direct contact with) the auxiliary line VSL through a first contact hole CNTa. The second conductive bank layer 300Pb may be electrically connected to (e.g., in direct contact with) the auxiliary line VSL through a second contact hole CNTb. The third conductive bank layer 300Pc may be electrically connected to (e.g., in direct contact with) the auxiliary line VSL through a third contact hole CNTc. The fourth conductive bank layer 300Pd may be electrically connected to (e.g., in direct contact with) the auxiliary line VSL through a fourth contact hole CNTd. As described with reference to FIGS. 2A and 2B, the auxiliary line VSL may be a common voltage transfer line that transfers the common voltage ELVSS to the first to third light-emitting diodes LED1, LED2, and LED3.

In an embodiment, the auxiliary line VSL may have a mesh shape. For example, the auxiliary line VSL may have a structure in which portions extending in an x-axis direction and portions extending in a y-axis direction are connected to each other. In an embodiment, light-emitting diodes may be disposed between portions of the auxiliary line VSL, the portions extending in the x-axis direction. For example, the first unit pixel area PA1 including the first to third light-emitting diodes LED1, LED2, and LED3 may be disposed between the portions of the auxiliary line VSL, the portions extending in the x-axis direction. In an embodiment, light-emitting diodes may be disposed in an area surrounded by portions of the auxiliary line VSL extending in the x-axis direction and portions of the auxiliary line VSL extending in the y-axis direction. For example, the second unit pixel area PA2 including the first to third light-emitting diodes LED1, LED2, and LED3 may be disposed in an area surrounded by portions of the auxiliary line VSL extending in the x-axis direction and portions of the auxiliary line VSL extending in the y-axis direction. One of the first to third light-emitting diodes LED1, LED2, and LED3 may be disposed.

As shown in FIG. 9, the auxiliary line VSL and a connection conductive layer CM connected to a transistor of a pixel circuit may be disposed on the same layer. In an embodiment, the auxiliary line VSL may be disposed on the first organic insulating layer 111. In an embodiment, a layer, on which the auxiliary line VSL is disposed, may be disposed between a layer, on which the first to third sub-pixel electrodes 1210, 2210, and 3210 are disposed, and a layer, on which a source electrode S and a drain electrode D of a transistor of the first to third sub-pixel circuits PC1, PC2, and PC3 are disposed. In the embodiment of FIGS. 8 and 9, in case that the auxiliary line VSL and the connection conductive layer CM are disposed on the same layer, a single conductive bank layer 300 overlaps a single unit pixel area including light-emitting diodes, and thus the display apparatus may have a relatively high resolution. Descriptions of the organic insulating layer 110 and the connection conductive layer CM of FIG. 9 are already given with reference to FIG. 6, but embodiments are not limited thereto. In another example, the display apparatus 1 may include three or more organic insulating layers, as shown on FIG. 5, and the auxiliary line VSL and the second connection conductive layer CM2 disposed on the first connection conductive layer CM1 may be disposed on the same layer.

The first to fourth conductive bank layers 300Pa, 300Pb, 300Pc, and 300Pd may each further include an exhaust opening 300OG penetrating (or passing through) the conductive bank layer 300 and exposing an upper surface of the organic insulating layer 110. The exhaust opening 300OG may provide a passage through which gas emitted from the organic insulating layer 110 is discharged. During an operation/process of manufacturing the display apparatus 1, impurities included in the organic insulating layer 110 may be discharged to the outside through the exhaust opening 3000G of each of the first to fourth conductive bank layers 300Pa, 300Pb, 300Pc, and 300Pd with being vaporized.

The exhaust opening 3000G may be disposed between the first light-emitting diode LED1 and the third light-emitting diode LED3, which are disposed adjacent to each other. For example, the exhaust opening 300OG may be disposed between the first sub-pixel electrode 1210 (refer to FIG. 9) of the first light-emitting diode LED1 and the third sub-pixel electrode 3210 (refer to FIG. 9) of the third light-emitting diode LED3, e.g., in a plan view. The exhaust opening 300OG may be disposed between two adjacent second light-emitting diodes LED2. The exhaust opening 300OG may be disposed between adjacent four light-emitting diodes (e.g., two adjacent second light-emitting diodes LED2, the first light-emitting diode LED1, and the third light-emitting diode LED3).

In an embodiment, as the conductive bank layers 300 are spaced apart from each other by the groove G, gas from the organic insulating layer 110 may be readily discharged as compared to a case where the conductive bank layers 300 are connected as one. As the groove G is included between adjacent conductive bank layers 300, impurities may be prevented from moving (or permeating) into the light-emitting diodes. Also, as one conductive bank layer 300 overlaps on a single unit pixel area including the light-emitting diodes, the resolution of the display apparatus 1 may be increased.

In an embodiment, as conductive bank layers 300 are spaced apart from each other, gas from an organic insulating layer 110, which does not overlap the conductive bank layers 300, may be readily discharged. According to an embodiment, penetration of external materials into the sub-pixels (e.g., P1, P2, and P3) may be reduced. According to an embodiment, penetration of external materials into the sub-pixels (e.g., P1, P2, and P3) may be reduced. In an embodiment, as the area/size of the conductive bank layers 300 is formed to be relatively small, infrared transmittance of the display apparatus 1 may be increased. However, these effects are examples, and the scope of the disclosure is not limited thereto.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display apparatus comprising:

a substrate comprising a display area and a non-display area outside the display area;

a pixel circuit layer disposed on the substrate and comprising at least one transistor;

a first sub-pixel electrode, a second sub-pixel electrode, and a third sub-pixel electrode spaced apart from each other and disposed on the pixel circuit layer in the display area;

a first conductive bank layer disposed on the first sub-pixel electrode and including a first opening overlapping the first sub-pixel electrode;

a second conductive bank layer disposed on the second sub-pixel electrode and including a second opening overlapping the second sub-pixel electrode; and a third conductive bank layer disposed on the third sub-pixel electrode and including a third opening overlapping the third sub-pixel electrode, wherein the first conductive bank layer, the second conductive bank layer, and the third conductive bank layer are spaced apart from each other.

2. The display apparatus of claim 1, wherein each of the first conductive bank layer, the second conductive bank layer, and the third conductive bank layer has an island shape.

3. The display apparatus of claim 1, further comprising:

an auxiliary line disposed in the display area on the substrate, electrically connected to the first conductive bank layer through a first contact hole, electrically connected to the second conductive bank layer through a second contact hole, and electrically connected to the third conductive bank layer through a third contact hole.

4. The display apparatus of claim 3, wherein the auxiliary line has a mesh shape.

5. The display apparatus of claim 3, further comprising:

a first connection conductive layer disposed on the pixel circuit layer and electrically connected to the at least one transistor.

6. The display apparatus of claim 5, further comprising:

a second connection conductive layer disposed on the first connection conductive layer and electrically connected to the first connection conductive layer, wherein the auxiliary line and the second connection conductive layer are disposed on a same layer.

7. The display apparatus of claim 5, wherein the auxiliary line and the first connection conductive layer are disposed on a same layer.

8. The display apparatus of claim 3, further comprising:

an organic insulating layer disposed between the pixel circuit layer and the first sub-pixel electrode, the second sub-pixel electrode, and the third sub-pixel electrode in the display area and extending from the display area to the non-display area;

a fourth conductive bank layer disposed on the organic insulating layer in the non-display area; and a common power supply line disposed in the non-display area and electrically connected to the auxiliary line to supply a common voltage, wherein the fourth conductive bank layer is electrically insulated from the common power supply line.

9. The display apparatus of claim 3, further comprising:

a first intermediate layer disposed on the first sub-pixel electrode in the first opening of the first conductive bank layer; and a first opposite electrode disposed on the first intermediate layer, wherein the auxiliary line is electrically connected to the first opposite electrode.

10. The display apparatus of claim 3, wherein the auxiliary line is configured to transfer a common voltage.

11. The display apparatus of claim 1, wherein a width between an inner side surface and an outer side surface of the first conductive bank layer is less than a width of the first opening of the first conductive bank layer.

12. The display apparatus of claim 1, wherein a distance between the first conductive bank layer and the second conductive bank layer is greater than a width between an inner side surface and an outer side surface of the first conductive bank layer.

13. The display apparatus of claim 1, wherein each of the first conductive bank layer, the second conductive bank layer, and the third conductive bank layer comprises a lower conductive layer and an upper conductive layer disposed on the lower conductive layer, and the lower conductive layer and the upper conductive layer comprise conductive materials having different etch selectivities.

14. A display apparatus comprising:

a substrate comprising a display area and a non-display area outside the display area;

a plurality of sub-pixel electrodes spaced apart from each other in the display area of the substrate;

a plurality of conductive bank layers respectively disposed on the plurality of sub-pixel electrodes and including openings respectively overlapping the plurality of sub-pixel electrodes; and an auxiliary line disposed between the substrate and the plurality of conductive bank layers and electrically connected to each of the plurality of conductive bank layers, wherein the plurality of conductive bank layers are spaced apart from each other, the display area comprises a first region in which the plurality of conductive bank layers are disposed and a second region outside the first region, and a size of the first region is less than a size of the second region.

15. The display apparatus of claim 14, wherein the second region does not overlap the plurality of conductive bank layers.

16. The display apparatus of claim 14, wherein at least a portion of the auxiliary line is between adjacent sub-pixel electrodes among the plurality of sub-pixel electrodes in a plan view.

17. The display apparatus of claim 14, wherein each of the plurality of conductive bank layers comprises a lower conductive layer and an upper conductive layer disposed on the lower conductive layer, and the lower conductive layer and the upper conductive layer comprise conductive materials having different etch selectivities.

18. A display apparatus comprising a first sub-pixel, a second sub-pixel, and a third sub-pixel, which emit light of different colors, respectively, the display apparatus further comprising:

each of a first unit pixel area and a second unit pixel area comprising at least one first sub-pixel, at least one second sub-pixel, and at least one third sub-pixel;

a first conductive bank layer disposed in the first unit pixel area and comprising openings respectively overlapping a first sub-pixel electrode of the first sub-pixel, a second sub-pixel electrode of the second sub-pixel, and a third sub-pixel electrode of the third sub-pixel in the first unit pixel area; and a second conductive bank layer disposed in the second unit pixel area and comprising openings respectively overlapping the first sub-pixel electrode of the first sub-pixel, the second sub-pixel electrode of the second sub-pixel, and the third sub-pixel electrode of the third sub-pixel in the second unit pixel area, wherein the first conductive bank layer and the second conductive bank layer are spaced apart from each other.

19. The display apparatus of claim 18, further comprising:

an auxiliary line electrically connected to the first conductive bank layer through a first contact hole and electrically connected to the second conductive bank layer through a second contact hole.

20. The display apparatus of claim 18, wherein each of the first conductive bank layer and the second conductive bank layer further comprises an exhaust opening between the first sub-pixel and the third sub-pixel in a plan view.

* * * * *